United States Patent
Zansky et al.

(10) Patent No.: US 7,208,955 B2
(45) Date of Patent: Apr. 24, 2007

(54) POWER RELAY OR SWITCH CONTACT TESTER

(75) Inventors: Zoltan Zansky, San Carlos, CA (US); William F. M. Jacobsen, Sunnyvale, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 132 days.

(21) Appl. No.: 11/081,264

(22) Filed: Mar. 15, 2005

(65) Prior Publication Data

US 2006/0212745 A1    Sep. 21, 2006

(51) Int. Cl.
*G01R 31/02* (2006.01)
*G01R 31/327* (2006.01)
*G01R 23/20* (2006.01)

(52) U.S. Cl. ...................... 324/418; 324/620
(58) Field of Classification Search ........ 324/415–424, 324/620, 615
See application file for complete search history.

(56) References Cited

U.S. PATENT DOCUMENTS

| | | | | |
|---|---|---|---|---|
| 3,925,723 A | * | 12/1975 | Millben | 324/420 |
| 4,028,615 A | * | 6/1977 | Jansen et al. | 324/419 |
| 4,459,437 A | * | 7/1984 | Gabry et al. | 379/27.08 |
| 5,748,001 A | * | 5/1998 | Cabot | 324/624 |
| 5,777,550 A | * | 7/1998 | Maltby et al. | 340/514 |
| 5,957,374 A | * | 9/1999 | Bias et al. | 236/78 R |
| 6,570,394 B1 | * | 5/2003 | Williams | 324/620 |
| 7,042,221 B2 | * | 5/2006 | Carney et al. | 324/314 |

OTHER PUBLICATIONS

Dell "*PowerEdge*" *2500 Systems*, User Guide, downloaded from http://support.dell.com/support/edocs/systems/pe2500/en/index.htm—http://support.dell.com/support/edocs/systems/pe2500/en/ug/127kwaa0.htm (Jun. 20, 2005, 5:20PM-5:15PM): 16 pages.

\* cited by examiner

*Primary Examiner*—Andrew H. Hirshfeld
*Assistant Examiner*—Hoai-An D. Nguyen
(74) *Attorney, Agent, or Firm*—Blakely Sokoloff Taylor & Zafman, LLP

(57) ABSTRACT

Embodiments of the invention include a test circuit having an auxiliary low power test signal generator, filters, and a detector to test a power switch. The generator sends an auxiliary low power test signal having a different frequency than a power signal for the switch to an input of the switch. The detector detects the auxiliary low power test signal at an output of the switch. Test circuit filters are used to filter out the power signal from reaching the auxiliary low power test signal generator or the detector circuit. A circuit of the test circuit is tuned to the test signal's different frequency to ensure that the detector only detects the test signal when the switch is in one position. Thus, by detecting or sensing the test signal across the switch, the detector can detect whether the switch is operating properly.

23 Claims, 13 Drawing Sheets

# POWER RELAY OR SWITCH CONTACT TESTER

BACKGROUND

1. Field

At least one embodiment of the present invention relates to testing alternating current or direct current power relays or switches.

2. Background

Electrically operated machines, such as general-purpose and special-purpose computing devices (e.g., "computers"), data storage systems, network servers, file servers, and Internet servers will fail or "crash" if not supplied with sufficient electrical power. As the purpose of such a machine becomes more important, so, too, are the measures taken to ensure that the machine's power source will not be interrupted. General-purpose and special-purpose computing devices commonly require direct current (DC) powered at several voltages. These DC voltages are typically produced by a system component called a power supply, which converts electrical energy from "hot" alternating current (AC) high voltage received, such as from a wall outlet, to DC lower voltages to be used by the device.

In order to protect a computing device, such as a network server, against power failures, a common technique is to install two or more identical power supplies, one or more of which is capable of providing the full amount of power required by the device. Also, the input of each power supply may be switched between one or more AC high voltage sources. For example, a first power supply may be connected to an ordinary wall socket or outlet which provides power at 120 Volts (V) AC at 60 Hertz (Hz) or 240 V AC at 50 Hz, while a second power supply is connected to an uninterruptable power supply (UPS) through another connection. If necessary, the UPS can provide power at a similar AC high voltage, such as from batteries. Thus, it is possible to use a relay or switch between the AC high voltage signals and the input of various power supplies of the computing device so that if either an AC high voltage power signal fails or a power supply fails, the computing device will continue to receive sufficient power to function.

In particular, a computing device, such as a network server may include switches or relays between "hot" alternating current high power input lines (e.g., such as connected to a wall socket and a UPS) and power supplies for supplying power to circuitry, components, mass storage device, disk drives, etc. of the computing device. A "hot" power signal may be defined as a signal within specification or within the contemplated specification for supplying power to a power supply of the computing device.

Often, to ensure functionality, computers and network servers include power transfer devices, switches, and/or relays to provide, prohibit, switch, or transfer power and/or ground to or between circuits and components. For instance, relays or switches may be used to switch the input or inputs of one or more computing device power supplies between two or more "hot" input AC high voltage signals, sources, generators, UPSs, etc. Thus, if an input AC high voltage signal, such as from a wall socket, UPS, or other source fails, relays or switches may be used to switch power supply input(s) to a different "hot" input AC high voltage signal. Similarly, if a power supply fails, relays or switches may be used to switch "hot" input AC high voltage signal(s) to a different functioning power supply. Thus, the relays and switches help ensure the reliability and functionality of the computing device by ensuring that it will continue to receive sufficient power to function. It can be appreciated that the reliability of the relays and switches will effect the reliability of the computing device. As such, it is desirable to ensure functionality of such relays and switches prior to needing them to switch power supply inputs to ensure the computing device does not fail. For instance, may be desirable to be able to determine when such relay or contact thereof is about to fail so that relay can be replaced or repaired prior to needing it to switch power supply inputs.

SUMMARY

Embodiments of the invention include a test circuit having a test signal generator and a detector to test the proper on/off operation and/or contact closure impedance of a power relay or switch. The test circuit uses the generator to send a test signal, having a different frequency than a power signal, to an input of the relay or switch. The test circuit uses the detector to detect the test signal at an output of the relay or switch.

BRIEF DESCRIPTION OF THE DRAWINGS

Various features, aspects and advantages will become more thoroughly apparent from the following detailed description, the set of claims, and accompanying drawings in which:

DETAILED DESCRIPTION

According to embodiments of the invention, AC or DC power transfer devices, switches, and relays may be tested to ensure proper relay contact closure, switch, coil, input connection, and output connection operation. For instance, such power transfer devices, switches, and relays may be tested while power is being switched or transferred during operation of a computing device, such as a network server. Moreover, embodiments provide for testing transfer devices, switches, and relays in other similar settings by using a test signal having a frequency distinct from the frequency of the signal being transferred, switched, or relayed across the tested device.

Figure 1:
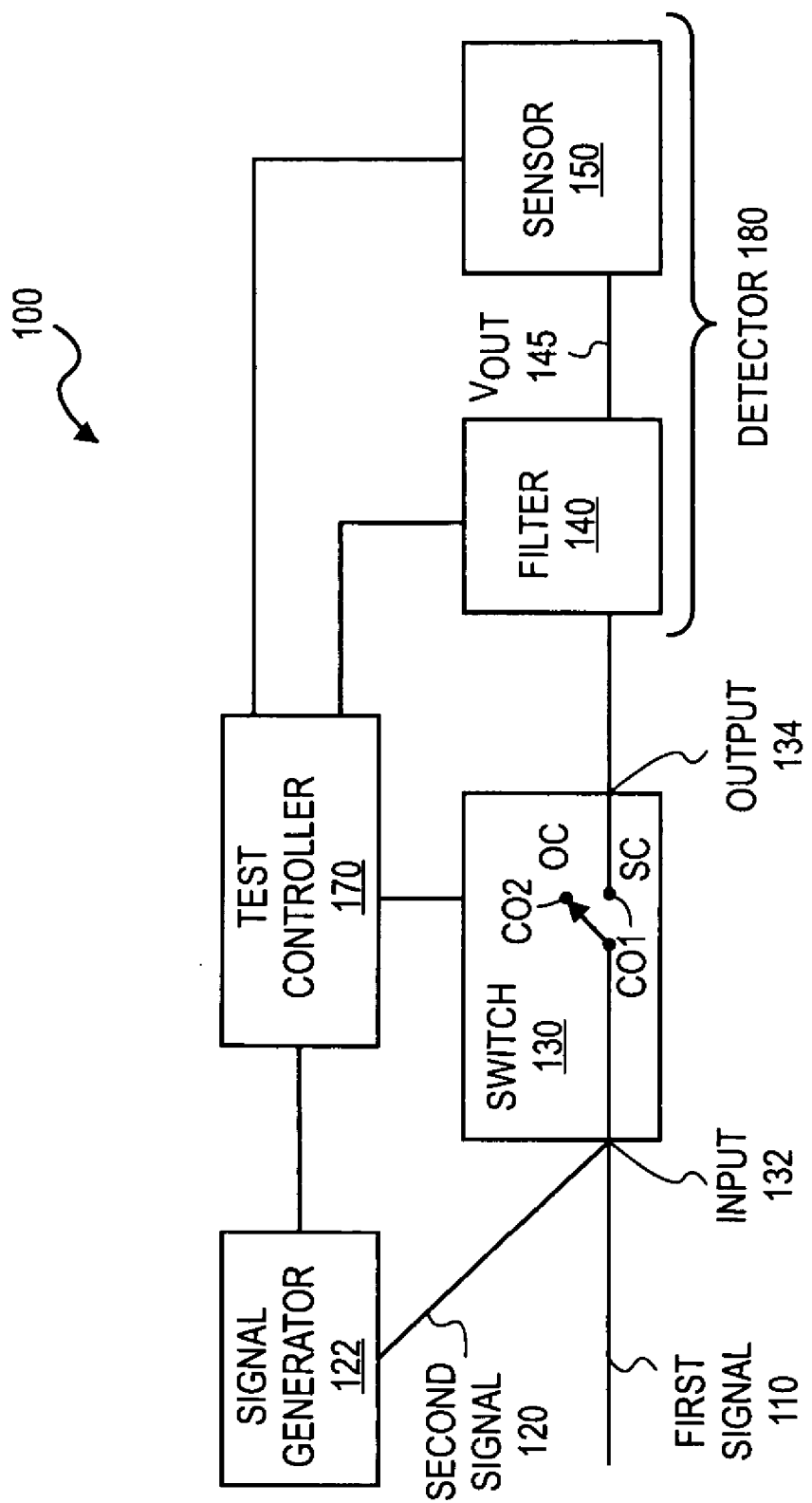
FIG. 1 is a block diagram showing a test circuit for testing a switch or relay in accordance with an embodiment of the invention.

For example, FIG. 1 is a block diagram showing a test circuit for testing a switch or relay in accordance with an embodiment of the invention. FIG. 1 shows system 100 including test controller 170 coupled to signal generator 122, switch 130, sensor 150, and (optionally) filter 140. First signal 110 is received at input 132 of switch 130 and second signal 120 is received at input 132 from generator 122. Output 134 of switch 130 is connected to filter 140, which provides voltage output Vout 145 to sensor 150. Filter 140 and sensor 150 may be defined as detector 180. Also, generator 122, filter 140, sensor 150, and optionally test controller 170 may be defined as a test circuit for testing switch 130.

Switch 130 includes open circuit position OC at contact C2, short circuit position SC at contact C1, input 132, and output 134. Thus, switch 130 connects input 132 to Contact C02 in position OC, and connects input 132 to Contact C02 and to output 134 in position SC. In other words, when switch 130 is in position OC, output 134 may be left as an open circuit or "open". Conversely, when switch 130 is in position SC, the signal or signals received at input 132 may be short circuited or "shorted" to output 134.

In embodiments, switch 130 may be a single pole single throw (SPST), single pole double throw (SPDT), double pole single throw (DPST), or a double pole, double throw (DPDT) switch, or a switch and relay therefore. It is also contemplated that switch 130 may be a relay, such as a relay including a switch and a coil and a relay input at which a signal may be received to cause the coil to switch the switch between positions. It is also considered that switch 130 could be a solid-state relay or switch, a mechanical relay or switch, a servo switch, or another device capable of passing or interrupting an electronic signal between points, such as using passive circuitry (e.g., capacitors, inductors, resistors), active circuitry (e.g., transistors, amplifiers, and operational amplifiers), rectifiers, logic, buffers, flip-flops, etc. as known in the art. It is also considered that switch 130 may represent a device having various electronic characteristics for various signals, such as by having a first transfer function between the input and the output in response to a first frequency, and a second transfer function between the input and output in response to a second frequency.

First signal 110 may be a power signal from a generator, a source, an ordinary wall socket, and/or from a UPS. Signal 110 may be generated by a local or remote generator, battery, or other power system. Moreover, signal 110 may be an AC signal having a frequency between approximately 10 and 400 Hz. Specifically, signal 110 may have a frequency approximately of 5 Hz, 10 Hz, 20 Hz, 40 Hz, 50 Hz, 60 Hz, 80 Hz, 100 Hz, 200 Hz, 400 Hz, or a combination thereof. Signal 110 may be an AC signal having a frequency that varies. It is contemplated that signal 110 may be an AC signal having various shapes such as a sine-wave, a square-wave, a saw-tooth wave, a zig-zag wave, or another alternating current wave as known in the art. Also, signal 110 may have a voltage of between approximately 20 and 500 volts AC. For example, signal 110 may be an AC signal having a peak-to-peak voltage of approximately 5 volts (V), 10 volts, 20 volts, 40 volts, 80 volts, 110 volts, 115 volts, 120 volts, 125 volts, 130 volts, 220 volts, 225 volts, 230 volts, 240 volts, 250 volts, 500 volts, or a combination thereof. Moreover, signal 110 may include a current between approximately 1 Ampere (Amp) and 200 Amps. For example, signal 110 may have approximately 1, 2, 3, 5, 10, 20, 25, 30, 50, 100, 200, or a combination thereof of Amps.

It is also contemplated that signal 110 may be a DC signal, such as a DC signal having current as described above and having a voltage of between approximately 2 and 300 volts. For example, signal 110 may be a DC signal having approximately 2.5, 5, 10, 12, 20, 40, 80, or a combination thereof of volts.

Signal generator 122 generates signal 120, such as a DC or AC signal as described above with respect to signal 110. However, second signal 120 has a different frequency than first signal 110 during testing of switch 130. Thus, either signal 110 or signal 120 may be a DC signal, but the other must be an AC signal. Also, although signal 110 or signal 120 may both be AC signals having a frequencies that vary, during testing of switch 130 the frequency of signal 110 is different than the frequency of signal 120.

It is contemplated that signal 120 may have a frequency between approximately 10 to 200000 times greater than the frequency of signal 110. For example, signal 120 may have a frequency that is approximately 10, 20, 30, 50, 100, 200, 400, 800, 1600, 3200, 6400, 12800, 25600, 51200, 102400, 204800 or a combination thereof times greater than the frequency of signal 110. In addition, signal 120 may have a maximum, or peak-to-peak voltage that is less than signal 110 by a factor of approximately 2, 3, 4, 5, 10, 20, 40, 50, 100, or a combination thereof. Specifically, signal 120 may have a peak-to-peak voltage of approximately 1, 2, 3, 4, 5, 7.5, 10, or a combination thereof of volts. For example, signal 110 may be an approximately 50 or 60 Hz, approximately 120 or 240 volt power signal while signal 120 is 5 volts peak-to-peak at a frequency at least 10000 times greater than signal 110. In some embodiments of the invention, signal 110 is distinguishable from signal 120 by passive or active electronic circuitry, such as filters and/or a circuit created when switch 130 is in position OC or SC. Thus, signal generator 122 may be an auxiliary low power test signal generator to generate auxiliary low power test signal 120 having a different frequency than power signal 110 to test switch 130 while power signal 110 is at input I1. It is also contemplated that signal 120 may have a voltage less than that of signal 110 by the same factors as described above.

Detector 180, including filter 140 and sensor 150, detects, senses, monitors, or identifies whether the auxiliary low power test signal (e.g., signal 120) is at output 134. As shown in FIG. 1, filter 140 is coupled between output 134 and sensor 150. Thus, filter 140 may filter out signal 110 but allow second signal 120 to pass to sensor 150. Sensor 150 may sense voltage output Vout 145 from filter 140 and determine whether switch 130 is functioning properly and/or which position switch 130 is in from Vout 145.

More particularly, in embodiments of the invention, generator 122 is an auxiliary high frequency generator circuit of a low voltage signal to be passed from output 134 to sensor 150 by filter 140 (e.g., such as a filter having "small" value capacitors in series with one or more inductors) which forms a resonance circuit whose quality factor (Q) is very high when switch 130 is in position SC, and a very low or substantially lower Q when switch 130 is in position OC. For instance, "substantially lower" is defined in this context as being at least 20 percent lower in magnitude, maximum voltage, and/or frequency.

Q is a measure of how much energy is lost in a circuit or device when it is driven by a sinusoidal signal. Capacitors or inductors are intended to store electromagnetic energy and are made as loss-free as possible. The Q is defined to be equal to 2π(2×Pi) times the ratio of the peak energy stored to the energy dissipated in one cycle. A high Q means high energy storage at low loss. Clearly, its value will depend upon the frequency. For a series RLC circuit resonant at a radian frequency of $\omega_0 = 1/\sqrt{LC}$, application of the definition leads to the following result for the quality factor at the resonant frequency, denoted $Q_0$:

$$Q_0 = \frac{\omega_0 L}{R_T} = \frac{1}{\omega_0 R_T C}$$

where $R_T$ represents the total series resistance, and L is the inductance and C is the capacitance of the circuit.

Thus, when switch 130 is in position SC, filter 140 forms a test circuit resonance circuit tuned to the test signal 120's different frequency to ensure that detector 150 can detect the signal, frequency or transfer function of signal 120 at output 134. Also, in position SC, filter 140 forms a test circuit resonance circuit tuned to filter out or prohibit signal 110 from passing through filter 140 to sensor 150 and damaging, destroying, "burning out", or otherwise inhibiting the functionality of sensor 150. Sensor 150 detects, senses, monitors, or identifies whether the auxiliary low power test signal (e.g., signal 120) is at output 134. By detecting or sensing the signal, frequency, or transfer function of signal 120 across switch 130, the sensor 150 can detect whether the relay or switch is operating properly and/or whether power signals will be properly switched by switch 130. For instance, by detecting signal 120 or detecting a substantially higher voltage of signal 120 (e.g., in either case, at the frequency of signal 120) when switch 130 is in position SC, and not detecting signal 120 when switch 130 is in position OC, it can be determined whether switch 130 is switching, contacting, or in the proper position while a power signal is active across the relay or switch.

Thus, system 100 detects whether switch 130 is operating properly, and/or is in the OC or SC position by filtering signal 120 from signal 110 and sensing whether signal 120 (e.g., a voltage at the frequency of signal 120) is provided at output 134 above a predetermined reference voltage level, indicating that switch 130 is successfully in position at SC. If second signal 120 is at output 134, it is evidenced or logical that signal 110 is also short circuited by switch 130 to output 134, as well. For instance, switch 130 may be described as having an open circuit or disconnected transfer function for signal 120 and for signal 110 in the OC position, and a connected or short circuit transfer function for signal 120 and signal 110 in the SC position. Thus, sensor 150 may detect signal 120 to identify whether or not the short circuit transfer function of switch 130 exists. Detection of the frequency of signal 120 by sensor 150 will confirm or evidence that the short circuit transfer of switch 130 for signal 110 also exists. In other words, detector 180 distinguishes the frequency of signal 120 from the frequency of signal 110.

As noted above, various other transfer functions, such as different transfer functions, for signal 120 and signal 110 when switch 130 is in the OC position or in the SC position are also contemplated. Moreover, see other transfer functions as described below for FIGS. 10–15.

It is contemplated that filter 140, sensor 150, and/or detector 180 may include passive circuitry (e.g., capacitors, inductors, resistors), active circuitry (e.g., transistors, amplifiers, and operational amplifiers), rectifiers, logic, buffers, flip-flops, etc. as known in the art. Moreover, in embodiments, filter 140, sensor 150, and/or detector 180 may monitor, detect, identify, sense, or otherwise determine whether signal 120, a frequency of signal 120, or a transfer function of switch 130 for signal 120 (or the frequency of signal 120) exists at output 134, such as by monitoring the frequency, voltage, current, or other signal characteristics of a signal output at output 134.

Test controller 170 may control turning on and off generator 122 to turn on and off signal 120. It is also considered that generator 122 may continuously provide signal 120. Also, test controller 170 may cause switch 130 to switch position between position OC and position SC, and vice versa. For example, test controller 170 may provide a switch, activation, or relay signal to switch 130 to switch the position of switch 130. The switch, activation, or relay signal to switch 130 (e.g., a signal from controller 170 or another source or signal generator) may be of a typical voltage, current, and/or frequency as known in the art for switching switch 130 as described herein. For instance, the signal to switch switch 130 may have a voltage of plus or minus approximately 0.25, 0.5, 0.75, 1, 1.25, 1.5, 2, 3, 5, 10, or a combination thereof of Volts. Also, test controller 170 may be coupled to filter 140, such as where filter 140 is an active, digital, or other controllable filter as known in the art. FIG. 1 also shows test controller 170 coupled to sensor 150, such as to receive a signal from sensor 150 that identifies or from which it can be identified whether Vout 145 includes signal 120, the transfer function of switch 130 for the frequency of signal 120, or not.

Thus, test controller 170 may be part of system 100, such as part of an integrated circuit, circuit board (e.g., printed circuit board, PCB), component, module, system, chassis, power input system, power supply relay system, mass storage device, mass storage system, server, or network server capable of testing switch 130 without accessing internal components or opening a location including switch 130, without manual intervention or access of switch 130, or a test connector thereto, or without human local or remote intervention whatsoever. For example, test controller 170 may be or may be part of an automated system, such as a system having a processor, memory, controller, state machine, logic, mechanical control system, or other automated (e.g., without human interaction during testing) system for testing switch 130. Specifically, test controller 170 may be computer controlled (e.g., such as by a processor executing a set of instructions which may be stored in a memory or received from optical or magnetic media) or software controlled to periodically or otherwise automatically test switch 130. Also, controller 170 may test switch 130 prior to the required switching of switch 130 in a system, such as a computer or network server during a test, such as a maintenance test, periodic test, stress test, operational test, reliability test, manufacturer's test, integration test, or other test as known in the art.

Embodiments of the invention also include a system without test controller 170. For example, signal generator 122, and switch 130 may be controlled by sensor 150. Also, generator 122 may be left continuously on, requiring no control. Moreover, switch 130 may be tested without controller 170 during a test, such as a manufacturer's test, integration test, or other test prior to assembly of switch into system 100, as known in the art.

It is also considered that generator 122 as part of system 100 may be permanently attached or coupled to input 132. Likewise, filter 140, sensor 150, and/or test controller 170 may be permanently coupled or attached to switch 130 and/or to each other as shown in FIG. 1. In some embodiments, generator 122 may not be coupled to test controller 170. Similarly, filter 140 may be not coupled to test controller 170, such as where filter 140 is a passive filter (e.g., including capacitors, resistors, and inductors). Likewise, test controller 170 may not be coupled to sensor 150, such as where sensor 150 provides switch failure or warning data about whether switch 130 is operating properly, other than to controller 170. As such, with or without controller 170; sensor 150 and/or controller 170 may warn of failed relays or switches, such as switch 130, as described below at FIG. 17. Similarly, with or without controller 170, sensor 150 and/or controller 170 may warn of successful tests of relays or switches, such as switch 130, similar to the description of warning of failures, as described below at FIG. 11.

In some embodiments, test controller 170 may be a controller that controls testing of switch 130, such as by controlling generator 122, switch 130, filter 140, and/or sensor 150, but does not control other operations of the computer, device, or system in which system 100 exists. Likewise, test controller 170 may receive a signal or determination from sensor 150 and may provide an output, warning, or indication of that signal to a person or system, and provide similar test information from similar switches or other components of a power system of which system 100 is a part, without providing other functionality of the computing system or server in which system 100 exists.

Thus, system 100 may be used to test switch 130 without a person opening the chassis or system in which system 100 exists, while system 100 is functioning, while a power signal, such as at signal 110, is applied across switch 130, without using an alternative or manual test device, such as a test meter, volt meter, or other manual device to test switch 130.

Figure 2:
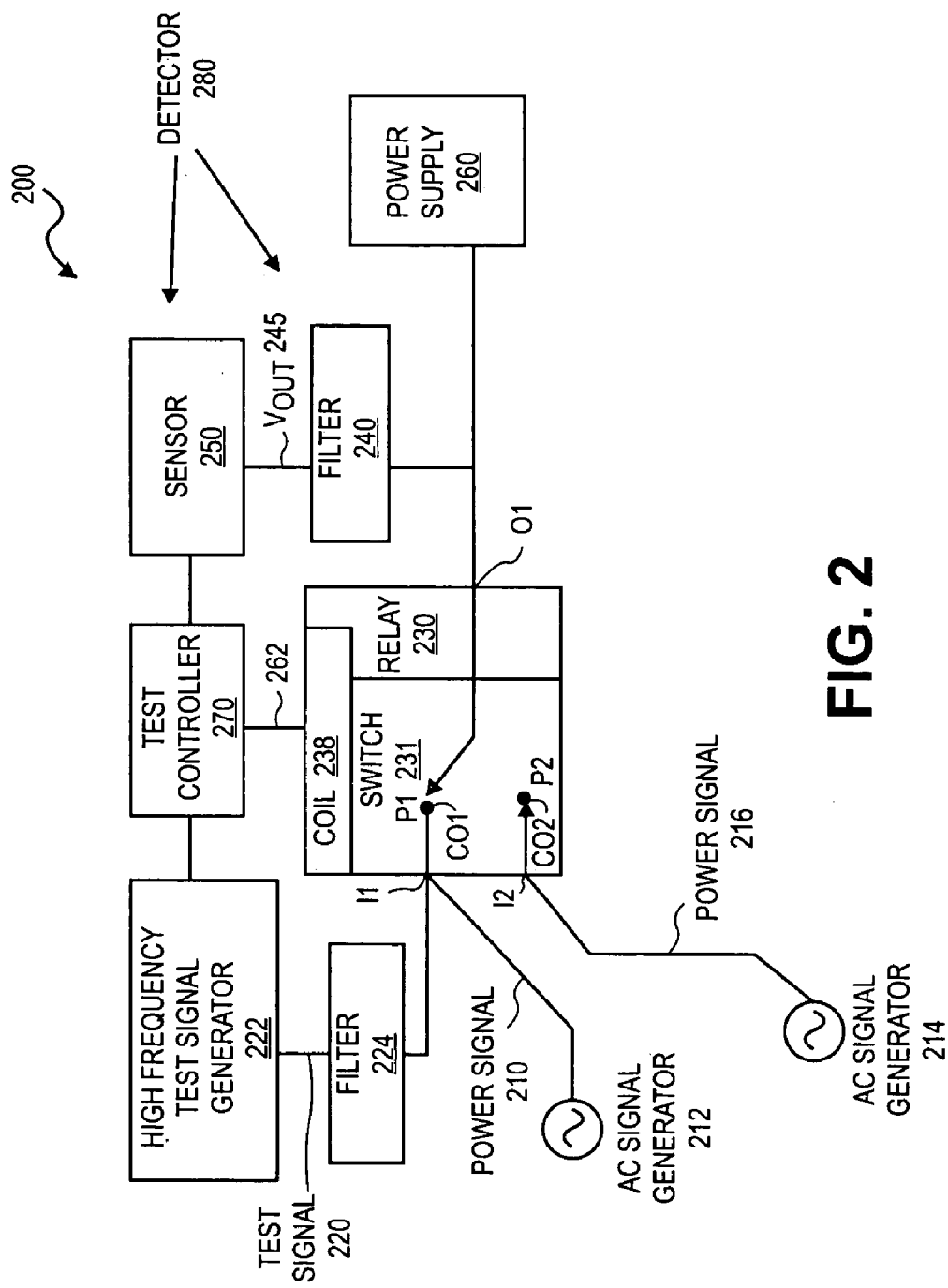
FIG. 2 is a block diagram showing a test circuit for testing a relay in accordance with an embodiment of the invention.

FIG. 2 is a block diagram showing a test circuit for testing a relay in accordance with an embodiment of the invention. The test circuit of FIG. 2 may be an embodiment of the test circuit of FIG. 1, or may be an embellishment of the test circuit of FIG. 1, such as by testing a relay and adding a filter between the test signal generator and the relay. FIG. 2 shows system 200 including relay 230 coupled to filter 224, filter 240, power supply 260 as an output load to AC signal 212 or 214, and test controller 270. Test controller 270 is also coupled to high frequency test signal generator 222 and sensor 250. Filter 240 provides output voltage Vout 245 to sensor 250. Filter 240 and sensor 250 may be defined as detector 280. Generator 222 provides a signal to filter 224 and filter 224 provides the same signal as test signal 220 to input I1. Input I1 also receives power signal 210 from alternating current signal generator 212. Input I2 receives power signal 216 from alternating current signal generator 214. Alternating signal generator 214 and power signal 216 are optional. For example, position P2 could be similar to position OC of FIG. 1. Also, generator 222, filter 224, filter 240, sensor 250, and optionally test controller 270 may be defined as a test circuit for testing relay 230.

Relay 230 includes coil 238 coupled to test controller 270 via line 262, and switch 231. Switch 231 includes input I1 coupled to contact C01 and input I2 coupled to contact C02. Switch 231 contacts contact C01 at position P1, and contacts contact C02 and position P2. Relay 230 also includes output O1 connected to switch 231. Thus, at position P1, switch 231 connects or short circuits signals (e.g., including signal 110, such as power source signals) at input I1 through contact C01 and to output O1. Similarly, at position P2, switch 231 connects or short circuits signals (e.g., including signal 110, such as power source signals) at input I2 through contact C02 and to output O1 to power supply 260. Relay 230 may be or include a switch such as switch 130 of FIG. 1.

It is contemplated that generator 222 may be a generator similar to generator 122, test controller 270 may be a test controller similar to test controller 170, sensor 250 may be a sensor similar to sensor 150, filter 240 may be a filter similar to filter 140, test signal 220 may be a signal similar to second signal 120, power signal 210 and/or 216 may be a signal similar to first signal 110, and switch 231 may be a switch similar to switch 130 of FIG. 1.

AC signal generators 212 and 214 may be generators to generate a signal, such as a power signal as described above with respect to first signal 110. Specifically, generator 212, and/or generator 214 may be a generator that provides power to a wall outlet, a UPS, or another power generator, as described above with respect to signal 110. In some cases, generator 212 may be a connection to a wall outlet and generator 214 may be a connection to a UPS; or vice versa.

Filter 224 prohibits or filters power signal 210 from entering generator 222. Thus, filter 224 may be an active or passive filter designed, such as by having a proper Q to prohibit signal 210 from passing through filter 224 to generator 222 and damaging, destroying, "burning out", or otherwise inhibiting the functionality of generator 222. Similar to the description of filter 140 for FIG. 1, filter 224 (e.g., such as a filter having "small" value capacitors) may pass test signal 222 to input I1, but filter signal 210 out from reaching generator 222.

Similarly, filter 240 may prohibit or filter signal 210 from reaching sensor 250. Filter 240 may be a filter as described with respect to filter 140 of FIG. 1. Filter 240 may be a filter as described with respect to filter 224. Moreover, filter 240 may have a high Q at the frequency of signal 220, but a substantially lower or Q more than 20% less at the frequency of signal 210. For example, filter 240 may have a Q that is approximately 20%, 25%, 30%, 40%, 50%, 60%, 80%, 90%, or 98% less at the frequency of signal 210 than it is at the frequency of signal 220. In some cases, filter 240 may include at least one inductor and at least one capacitor in series.

Power supply 260 as a load to AC signal generator 212 and 214, may be one or more power supplies of a computing device, such as a network server. Power supply 260 may also represent another type of electronic load for signal 210, such as one or more mass storage devices (e.g., a disk drive), processors, memories, input devices, output devices, and/or other active or passive circuitry of an electronic or computing device. Thus, relay 230 may switch between signal 210 and signal 216 in order to ensure that power supply 260 has a "hot" AC power signal. A "hot" power signal may be defined as a signal within specification or within the contemplated specification for supplying power to power supply 260. Power supply 260 may provide a part or all of the power required by a computer system load, or network server load. In one example, power supply 260 may provide DC voltages such as +12 volts, +5 volts, and −12 volts.

Hence, relay 230 may be used to switch to or select signal 210 or signal 216 when the other signal goes down, fails, or is not "hot". However, relay 230 may fail to switch, such as if the switch becomes welded to contact C01 or contact C02, coil 238 burns out, open circuits, or otherwise fails to actuate switch 231, switch 231 fails, input I1 or P2 fails, or output O1 fails. Without testing, such failures can go undetected until signal 210 or signal 216 is interrupted, has insufficient power, or is not "hot", at which time power supply 260 will be unable to receive a sufficient signal from output O1, since relay 230 is unable to switch and attempt to gain sufficient power from the alternate signal (e.g., signal 210 or signal 216). Thus, in this situation, the load of power supply 260 may experience a power interruption. Such undetected failures of relay 230 are called latent single-point failures, since the single point for the failure of switching from the failing signal 210 or 16 to the other signal is relay 230 and since that failure is only discovered when signal 210 or signal 216 fails, and causes supply 260 to fail as well.

Several failures of relay 230 are latent because they cannot normally be detected without actually triggering the failure. In some cases, this is because signal 210 and signal 216 are similar in characteristics, such as frequency and voltage. Thus, it is desirable to test relay 230 to detect failures of the relay before such failures cause supply 260 to fail. However, detecting signal 210 or signal 216 at output O1 while switching relay 230 may not provide a sufficient test of relay 230 since the same signal will be detected at output O1 regardless of whether relay 230 switches from position P1 to position P2 or vice versa, as signal 210 is similar to signal 216.

Consequently, filter 224, generator 222, filter 240, sensor 250, and optionally test controller 270 provide a test circuit for successfully testing relay 230 during operation of supply 260 by determining whether relay 230 has switched between contact C01 and contact C02, such as is described above with respect to switch 130 of FIG. 1. Hence, regardless of the frequency or type of signal at signal 210 and signal 216 (e.g., such as when signal 210 and signal 216 are similar in frequency and voltage), sensor 250 may determine whether relay 230 is operating properly by sensing signal 220 at output O1 when switch 231 is in position P1 and detecting absence of signal 220 at output O1 when switch 221 is in position P2. In some cases, testing includes determining whether signal 220, the frequency of signal 220, or the transfer function for switch 231 for signal 220 is at output O1 when switch 231 is at position P1 and then making the same determination after switching to switch 231 to position P2. Alternatively, testing may include sensing or detecting while switch 231 is at position P2 and then switching the switch to position P1. It is also considered that switch 231 may be cycled from P1 to P2 back to P1; or from P2 to P1 and back to P2 during testing.

Hence, system 200 provides a test circuit for determining the single latency failure point of relay 230. Moreover, system 200 provides the advantages of having test controller 270 similar to test controller 170 as described above with respect to FIG. 1. Thus, test controller 270 may provide a voltage or activation signal via line 262 to coil 238 to switch switch 231 between position P1 and position P2, such as to test relay 230 as described with respect to testing switch 130 of FIG. 1.

Also, filter 224, generator 222, test controller 270, sensor 250, and filter 240 maybe permanently coupled or attached to relay 230 as described above with respect to generator 122, test controller 170, filter 140, and sensor 150 of FIG. 1. Moreover, test controller 270 may or may not be coupled to generator 222, coil 238, and/or sensor 250 as described above with respect to test controller 170. Next, test controller 270 may be optional, such as where sensor 250 controls generator 222, where generator 222 is always on, or otherwise.

In some cases, test controller 270 may cause relay 230 to be tested at a specific time, periodically, or as a result of an event of the system or computing system in which system 200 exists. For example, test controller 270 may cause relay 230 to be tested every minute, every hour, every day, every week, every year, or a combination thereof, periodically. Also, test controller 270 may cause relay 230 to be tested as a result of an occurrence or event within the computing system, such as a network server, or a signal received by the computing system or network server, in which system 200 exists.

Figure 3:
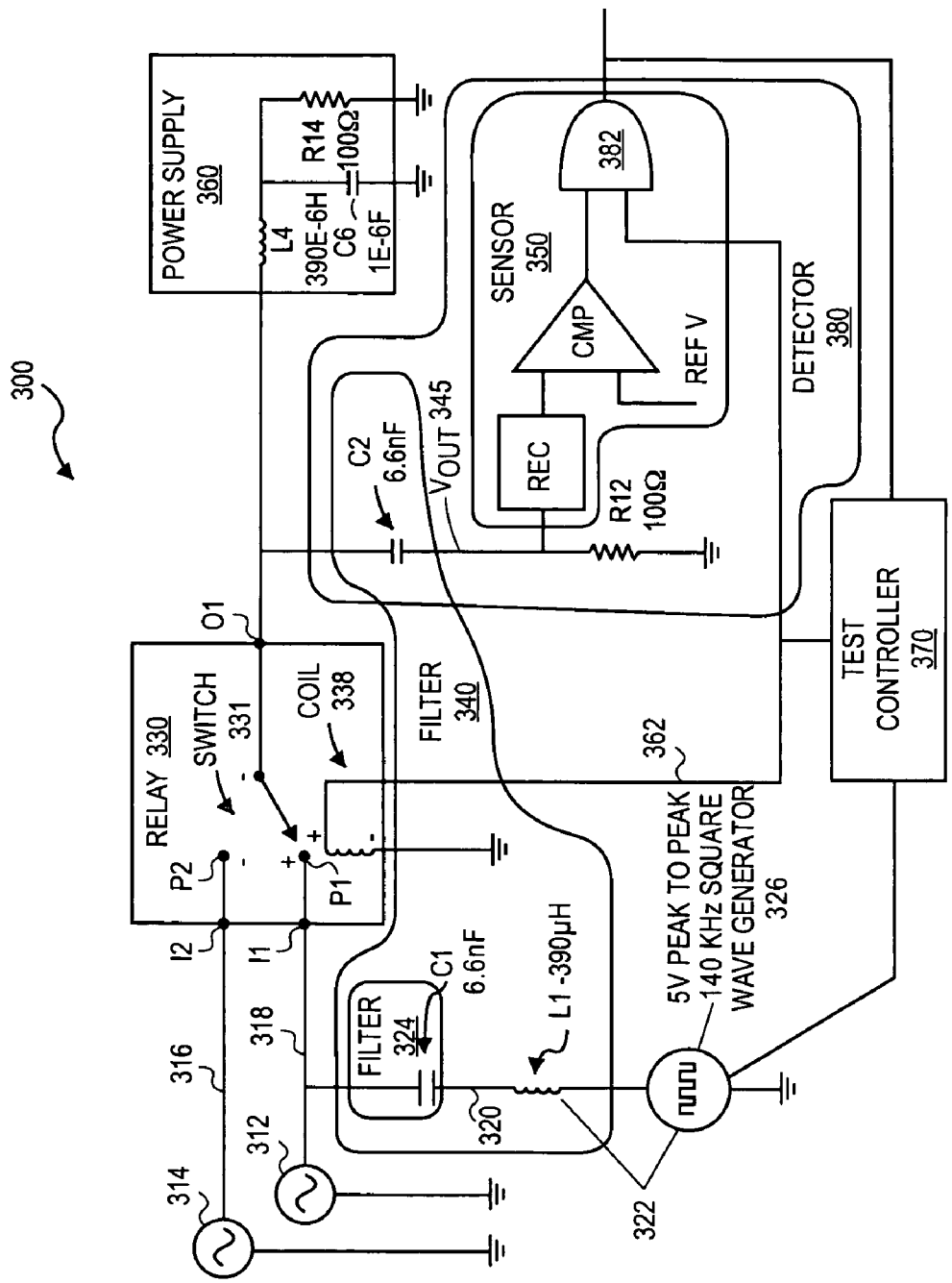
FIG. 3 shows an electronic circuit schematic diagram of a test circuit for testing a relay in accordance with an embodiment of the invention.

FIG. 3 shows an electronic circuit schematic diagram of a test circuit for testing a relay in accordance with an embodiment of the invention. FIG. 3 shows system 300 including relay 330 coupled to filter 324, filter 340, power supply 360, and test controller 370. Test controller 370 is also coupled to high frequency test signal generator 322 (having generator 326 and inductor L1) and sensor 350. Filter 340 provides output voltage Vout 345 to sensor 350. Sensor 350 includes rectifier Rec, signal comparator CMP, and logic And gate 382. Filter 340 and sensor 350 may be defined as detector 380. Generator 322 provides test signal 320 past inductor L1 to filter 324 and filter 324 provides the same signal as to input I1. Input I1 also receives power signal 310 from generator 312. Input I2 receives power signal 316 from generator 314. Generator 314 and power signal 316 are optional. For example, position P2 could be similar to position OC of FIG. 1. Also, generator 322, filter 324, filter 340, sensor 350, and optionally test controller 370 may be defined as a test circuit for testing relay 330.

Relay 330 may be a relay similar to relay 230, switch 331 may be a switch similar to switch 231, and coil 338 may be a coil similar to coil 238 of FIG. 2. Relay 330 receives signal 316 at input I2 from generator 314, and receiving signal 310 at input I1 from generator 312. Relay 330 includes switch 331 to switch between position P1 and position P2 in response to a signal at coil 338. Thus, relay 330 may provide the signal input to input I1 or input I2 at output O1.

Signal 316 may be a signal similar to signal 216, generator 314 may be a generator similar to generator 214, signal 310 may be a signal similar to signal 210, generator 312 may be a generator similar to generator 212, filter 324 may be a filter similar to filter 224, filter 340 may be a filter similar to filter 240, and power supply 360 may be a power supply similar to power supply 260 of FIG. 2.

For instance, generator 312 and/or 314 may be a local or remote power signal generator, source, ordinary wall socket, battery, UPS and/or other power source to provide "hot" input AC high voltage signals to power supply 360. Specifically, generator 312 may generate signal 310 which is power from a wall outlet, while generator 314 is a UPS to take over providing power to supply 360 via switching if relay 330 if signal 310 fails; or vice versa.

Relay 330 is coupled to power supply 360 as load to power sources 312 or 314. Power supply 360 has inductor L4 of 390 E-6 (micro, e.g., "u") Henry (H). Power supply 360 also includes capacitor C6 having a value of 1 E-6 Farad (F) in parallel with resistor R14 representing a loaded power supply having a value of 100 Ohms (Ω) between inductor L4 and ground. Moreover, power supply 360 may be a power supply as described above with respect to power supply 260 of FIG. 2. Specifically, power supply 360 may resistor R14 as a power "load" or drain. Also, power supply 360 may provide a high frequency, high impedance load that is not effected and does not drain test signal 320. For instance, power supply 360 may define an electromagnetic interference (EMI) suppression filter including inductor L4 and capacitor C6 to filter out test signal 320 from reaching load R14. By having appropriate values for inductor L4 and capacitor C6 to have a low Q or low resonance at the frequency of test signal 320 when relay 330 is in position P1 or position P2.

FIG. 3 shows test signal 320 provided by test signal generator 322 and coupled to input I1. Test signal generator 322 includes an approximately 5 Volt peak-to-peak 140 kHz square wave generator 326 and inductor L1 having a value of 390 micro H. Filter 324, such as capacitor C1 having a value of 6.6 nano (n) F, is coupled between generator 322 and input I1. Filter 324 may correspond to filter 224 described above with respect to FIG. 2. Similarly, generator 322 may correspond to generator 222 described above with respect to FIG. 2. Specifically, filter 324 prohibits signal 310 from reaching inductor L1 or generator 326. Moreover, the Q or resonance frequency of the circuit including capacitor C1 and inductor L1 has a resonance peak or a high Q at the frequency of generator 326, but a substantially lower Q at the frequency of signal 310. Thus, when switch 331 is in position P1, the circuit formed between capacitor C1, inductor L1, capacitor C2, and resistor R12 will have a Q that allows the voltage of signal 320 to be read at output voltage Vout 345 (e.g., across resistor R12). However, when switch 331 is in position P2, the circuit formed through relay 330 will not include capacitor C1 and inductor L1 and will have a substantially lower Q at the frequency of signal 316, such that the signal at Vout is much less without the existence of capacitor C1 and inductor L1 in the circuit. In other words, capacitor C2 having a value of 6.6 nano F will filter the frequency of signal 316 out from reaching Vout 345 (e.g., being read across resistor R12). Thus, capacitor C2 acts as filter 340 similar to filter 240 of FIG. 2 in this situation. Alternatively, when switch 331 is in position P1, capacitor C2, capacitor C1, and inductor L1 form filter 340, such as performing the function of filter 240 of FIG. 2, and prohibit signal 310 from reaching Vout 345 (e.g., filter signal 310 out from reaching resistor R12) but allow signal 320 to reach Vout 345 (e.g., pass signal 320 through as a voltage signal readout across the resistor R12).

For instance, capacitor C1 and/or C2 may each have a capacitance value of approximately 0.25, 0.3, 0.5, 1, 2, 3, 5, 10, 20, 40, 80 or a combination thereof of nano (n) F. Also, Capacitor C1 and/or C2 may or may not have values that are matching, approximately ¾, ½, ⅓, ¼, ⅙, 1/10, or any combination thereof as compared to each other. Inductor L1 may have an inductance value of approximately 5, 10, 20, 25, 30, 50, 100, 200, 300, 500, 1000, 2000, 4000, 8000 or a combination thereof of micro-Henry (H).

Detector 380 includes filter 340 and sensor 350, and may perform a function similar detector 280 of FIG. 2. Also, Sensor 350 may be a sensor similar to sensor 250 of FIG. 2. However, sensor 350 (and thus detector 380) includes rectifier Rec, signal comparator CMP, and And gate 382. Detector 380 also includes resistor R12 and capacitor C2. Thus, in FIG. 3 output O1 is coupled to detector 380 including capacitor C2 having a value of 6.6 nano F and resistor R12 having a value of 100 Ω. Output voltage Vout 345 between capacitor C2 and resistor R12 is coupled to rectifier REC such as a rectifier to rectify the voltage received having a frequency of signal 320 and provide that voltage to signal comparator CMP. Rectifier REC may be a standard or regular rectifier such as having a rectification inaccuracy 10% (e.g., rectify an AC signal to a DC signal with a voltage conversion efficiency of 90%), or may be a precision rectifier, such as by having a rectification innacuracy of 1% (e.g., have an efficiency of 99%). Signal comparator CMP also receives reference voltage REFV and provides an output to And gate 382. Specifically, the output of signal comparator CMP is the difference between the rectified signal received from rectifier REC and reference voltage REFV. Reference voltage REFV may be selected so that when the rectified voltage from Vout 345 is at a certain level (e.g., a "signal", "voltage", and/or "level" may be described as a certain voltage amplitude peak, peak to peak of an AC voltage; or rectified level peak or peak to peak of an AC voltage), comparator CMP provides an output of a logical "1", high, or active signal to And gate 382.

FIG. 3 shows test controller 370 coupled to coil 338, generator 326 and And gate 382. Controller 370 may be a controller as described above with respect to controller 270 of FIG. 2. Test controller 370 is optional similar to test controller 170 and test controller 270. Test controller 370 may provide a test, activation, or relay signal to coil 338 via line 362 to switch switch 331 between position P1 and position P2, such as to test relay 330 as described with respect to testing switch 130 of FIG. 1.

Test controller 370 may also provide the test, activation, or relay signal to And gate 382. Thus, when And gate 382 receives a signal to cause switch 331 to be at position P1 and receives a signal from CMP that signal 320, the frequency of signal 320, or the transfer function of the frequency of signal 320 is present at Vout 345, And gate 382 provides an output of a logical "1", high, or active signal, such as to controller 370.

Figure 4:
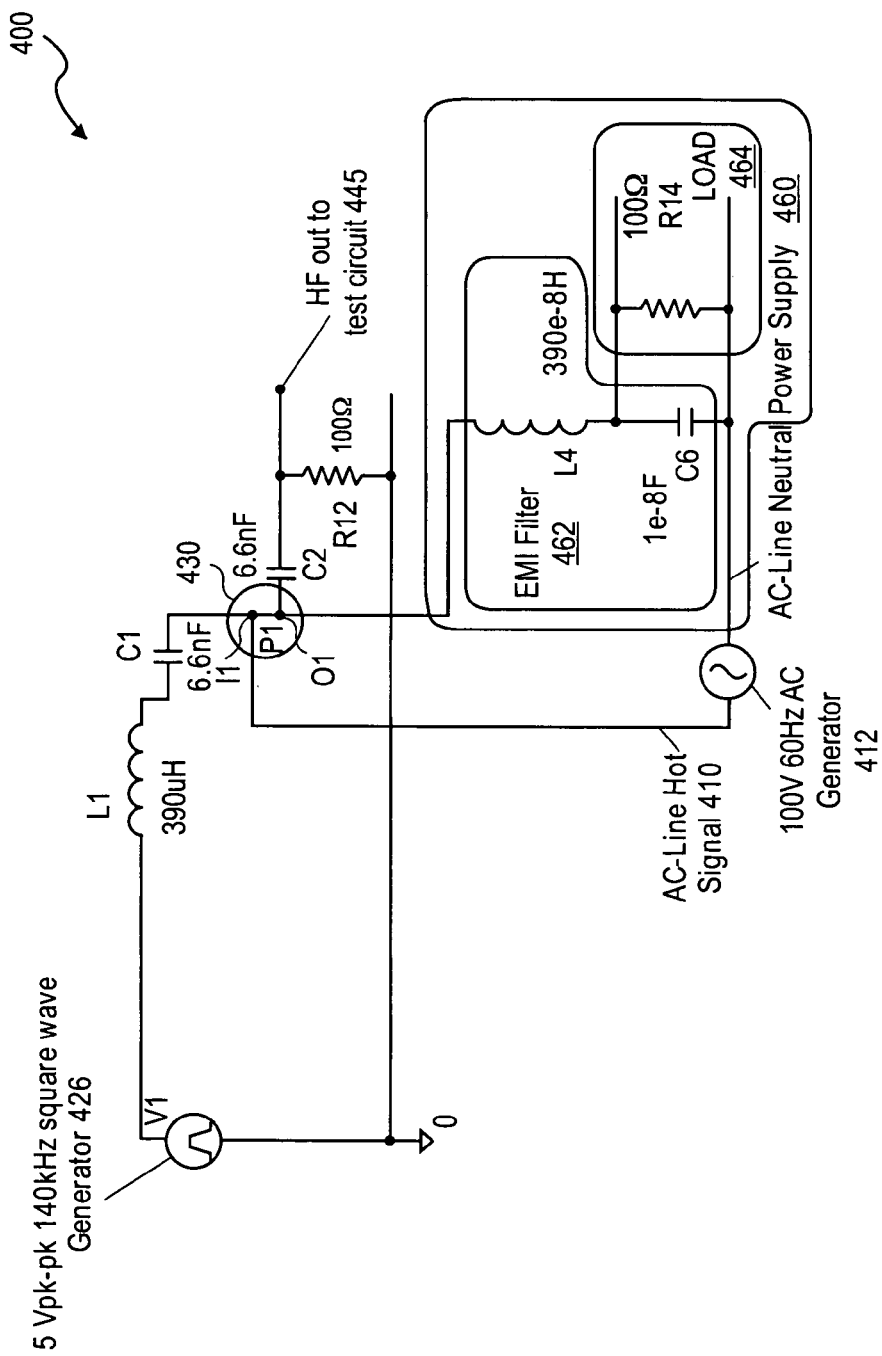
FIG. 4 shows an electronic circuit schematic diagram of a test circuit for testing a switch or relay when the switch or relay is closed.

FIG. 4 shows an electronic circuit schematic diagram of a test circuit for testing a switch or relay when the switch or relay is closed. FIG. 4 shows system 400, which may be all or part of system 300 when switch 331 is in position P1. For example, system 400 includes approximately 5 Volts peak-to-peak 140 kHz square wave generator 426, such as generator 326 of FIG. 3. FIG. 4 also includes inductors L1 and L4; capacitors C1, C2, and C6; and resistors R12 and R14 as described above for FIG. 3. FIG. 4 includes high frequency (HF) output to test circuit 445 similar to Vout 345 of FIG. 3. FIG. 4 includes AC line hot signal 410 similar to signal 310, generator 412 similar to generator 312, and power supply 460 similar to power supply 360 of FIG. 3. FIG. 4 includes switch 430 in position P1 such as creating a short circuit between output I1 and output O1. Switch 430 may represent relay 330 and/or switch 331.

In FIG. 4, power supply 460 defines electromagnetic interference (EMI) filter 462 including inductor L4 and capacitor C6. EMI filter 462 may filter out the test signal from generator 426, such as by having appropriate values for inductor L4 and capacitor C6 to have a low Q or low resonance at the frequency of the test signal from generator 426 when switch 430 is in position P1. Power supply 460 also defines load 464 including resistor R14.

Hence, the circuit shown in FIG. 4 allows capacitor C2 to filter out the power signal from the generator 412 from circuit 445. Similarly the circuit of system 400 allows capacitor C1 to filter out the signal of generator 412 from reaching generator 426. Meanwhile the circuit of system 400 includes inductor L1 in series with capacitor C1 and capacitor C2 and resistor L12 creating a resonance frequency at the frequency of generator 426, and substantially lower at the frequency of generator 412. Thus, circuit 445 receives the signal from generator 426, but receives very little (such as less than 5%) or none of the signal from generator 412.

More particularly, the typical series resonant tank circuit for a 100 W power supply (e.g., generator 412) may be L1=390 micro(u)H, _C1=3.3E-9 (the equivalent of C1 in series of C2, if C1=C2) and sense resistor R12=100 Ohm. At resonance with the 140 kHz oscillator (e.g., generator 426), high current is flowing in this tank circuit, thus voltage across the R12 sense resistor is several volts (e.g., at circuit 445). The resonant tank circuit frequency is: $f=1/(2\times Pi\times (L\times C)^{0.5}) = 1/(2\times 3.14 \times (390E-6\times 3.3E-9)^{0.5}) = 140$ kHz.

Also, for EMI filter 462, L4=390 uH and C6=1 uF are the EMI suppression inductance and capacitance of power supply 460 (e.g., to suppress the signal from generator 426 from reaching the load of the power supply). Power supply 460 is fed power (e.g., from generator 412) through the relay switching circuit (e.g., switch 430). R14 represents a typical 100 W power supply load for power supply 460.

Figure 5:
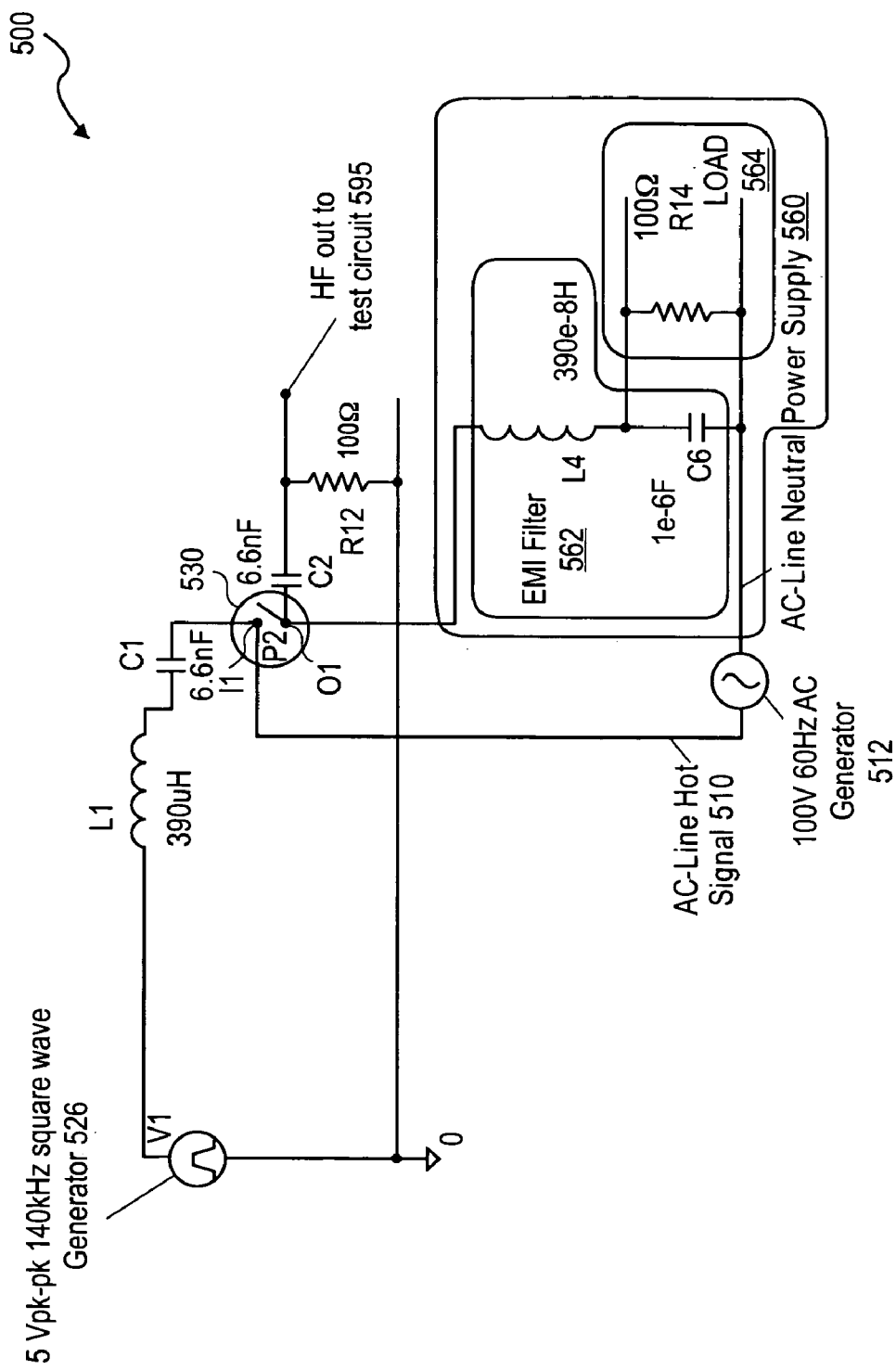
FIG. 5 shows an electronic circuit schematic diagram of a test circuit for testing a switch or relay when the switch or relay is open.

Alternatively, FIG. 5 shows an electronic circuit schematic diagram of a test circuit for testing a switch or relay when the switch or relay is open. FIG. 5 shows system 500 including generator 526 such as generator 426, circuit 545 such as circuit 445, AC line hot signal 510 such as line hot signal 410, generator 512 such as generator 412, and power supply 560 such as power supply 460 of FIG. 4. Switch 530 may represent relay 330 and/or switch 331.

The distinction between FIG. 5 and FIG. 4 is that FIG. 5 includes switch 530 in position P2 such as creating an open circuit between output I1 and output O1. Thus, capacitor C2 still filters out the signal from generator 512 from reaching circuit 545. Moreover, the signal from generator 526, inductor L1, and capacitor C1 are not in series with capacitor C2 or a part of circuit 545 prior to passing through the AC line neutral of generator 512 and inductor L4 and capacitor C6 of power supply 560. In other words, a voltage reading at circuit 545 will be lower for FIG. 5 than a reading at circuit 445 for FIG. 4 because system 500 does not resonate at the frequency of generator 526 (e.g., the Q system 500 is low at the frequency of generator 526).

More particularly, the resonant circuit may now be L1, _C1 (the equivalent of C1 in series of C2, if C1=C2) R12 and C6 in series with L4. This circuit is no more in resonance and its Q is low. The resonant tank circuit frequency is now: $f=1/(2\times Pi\times (L\times C)^{0.5})=1/[2\times 3.14\times ((390E-6+390E-6)\times 3.3E-9)^{0.5}]=99$ kHz.

Thus this tank circuit is no longer in resonance with the 140 kHz oscillator frequency (e.g., generator 526). Hence, the resonant tank current is lower and the current flowing through the R14 sense resistor is lower.

Figure 6:
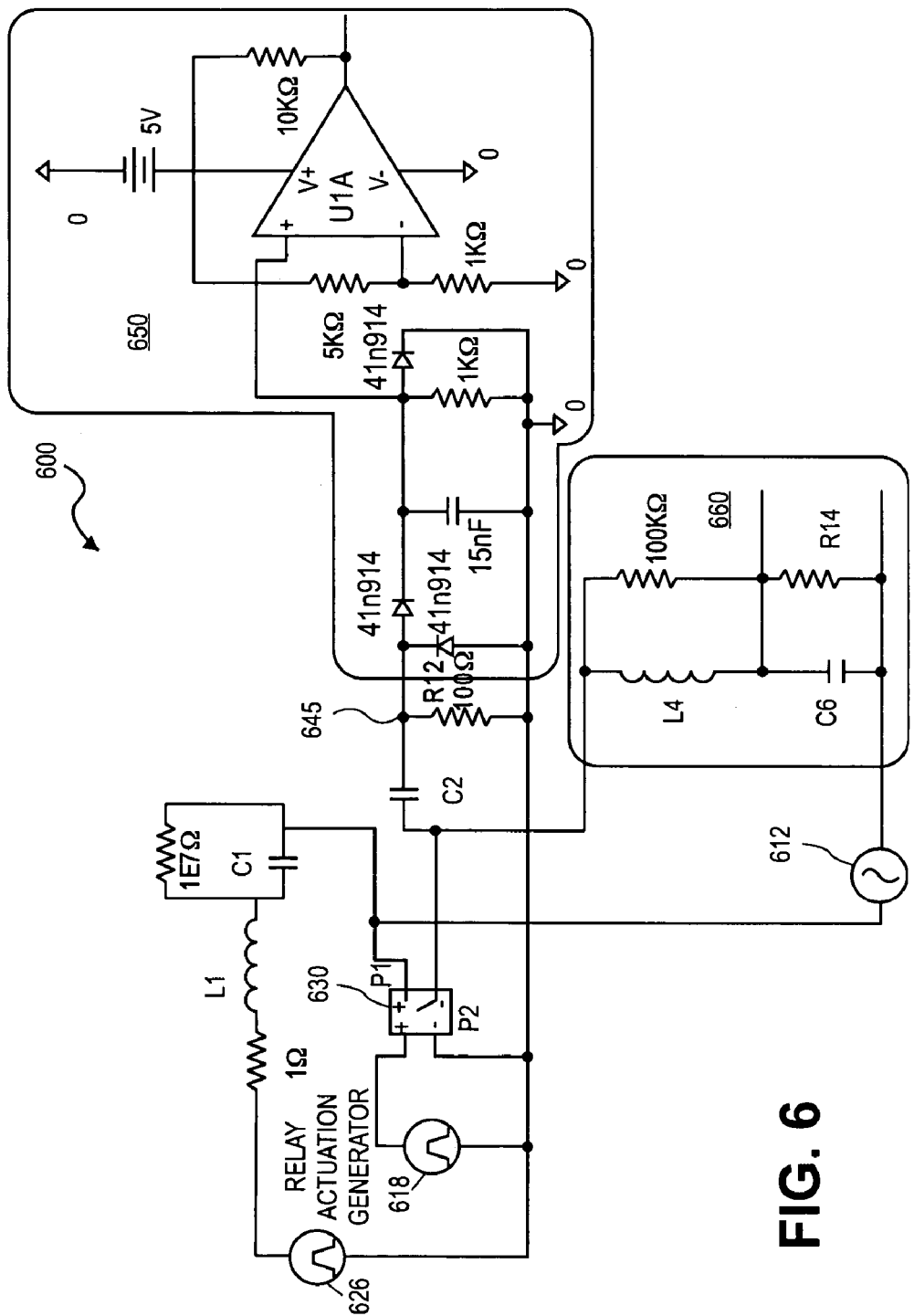
FIG. 6 shows an electronic circuit schematic diagram of a computer model that may be applicable for any of FIGS. 3–5.

FIG. 6 shows an electronic circuit schematic diagram of a computer model that may be applicable for any of FIGS. 3–5. For example, the computer model of FIG. 6 may be modeled in a computer aided design (CAD) application to simulate performance of FIG. 6 or system 100, 200, or 300 during operation. FIG. 6 shows system 600 including generator 626 such as generator 526, circuit 645 such as circuit 545, and generator 612 such as generator 512 of FIG. 5. For instance, generator 626 may model a test signal such as signal 326, 426, or 526 of FIGS. 3–5. Relay 630 may be a relay such as relay 330, to switch between positions shown by switch 430 and 530, as shown in FIGS. 3–5. FIG. 6 also includes inductors L1 and L4; capacitors C1, C2, and C6; and resistors R12 and R14 out described with respect to FIG. 5. FIG. 6 includes power supply 660, similar in functionality to power supply 260 of FIG. 2 and/or power supply 360 of FIG. 3. Likewise, FIG. 6 includes sensor 650 similar to all or some of the functionality of sensor 250 of FIG. 2 and/or sensor 350 of FIG. 3.

FIG. 6 also shows relay actuation generator 618 generating a square wave to actuate relay 630. For example, in the computer model, generator 618 may generate a square wave having a frequency of approximately 2.5 kHz and a peak to peak voltage of 1.5 volts to activate switching of relay 630 for testing of the computer model of FIG. 6. Relay 630 may also be switched by a switch, activation, or relay signal from a controller, another source, or another signal generator using a signal of a typical voltage, current, and/or frequency as known in the art for switching the relay. Moreover, the signal to switch relay 630 may have a voltage of plus or minus approximately 0.25, 0.5, 0.75, 1, 1.25, 1.5, 2, 3, 5, 10, or a combination thereof of Volts. FIG. 6 may include various other resistors, inductors, capacitors, diodes, voltage sources, and circuitry required for a computer model that may or may not be required or shown for the examples or embodiments described above with respect to FIGS. 3–5.

Figure 7A:
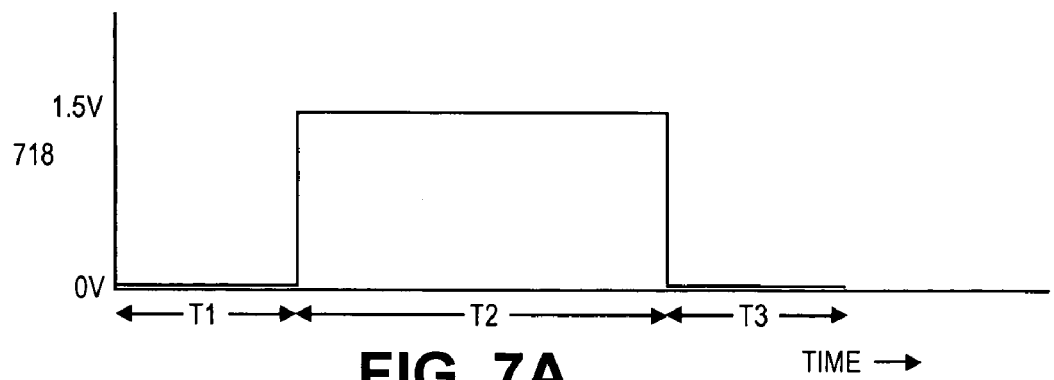
FIG. 7A shows a signal flow diagram of a relay activation voltage for FIG. 6.

FIG. 7A shows a signal flow diagram of a relay activation voltage for FIG. 6. FIG. 7A shows relay actuation voltage 718 such as the signal generated by generator 618 of FIG. 6. FIG. 7 shows voltage 718 at 0 volts during period T1 and T3 and at approximately 1.5 volts during period T2. Thus, the situation of FIG. 5 may exist during periods T1 and T3 and situation of FIG. 4 may exist during period T2. After T3, T1 may be repeated and so on to form a continuous square waveform. In embodiments where generator 618 generates a square wave having a frequency of 2.5 kHz, T2 may be a period of 2.0E-4 seconds and T1 plus T3 may also be 2.0E-4 seconds.

It is also contemplated that the device, switch, or relay to be tested may be switched for period T2 between approximately 0.5 seconds and 10 seconds. For example, period T2 may be a period of approximately 0.1, 0.25, 0.3, 0.5, 1, 2, 3, 4, 10, 20, 40, 80, 160, 200, 400, 800, 1600, 3200, 6400 seconds or any combination thereof. Also, the ratio of T2 to T1 and/or T3 can be any practical value, such as approximately $1/100^{th}$, $1/200^{th}$, $1/300^{th}$, $1/500^{th}$, $1/1000^{th}$, $1/10000^{th}$, etc., or combinations or multiples thereof. Moreover, as noted above, period T1, T2, and T3 may rep-resent a test switching wave, such as a square wave, sine wave, or other wave as known in the art for switching the device, switch, or relay during testing.

Figure 7B:
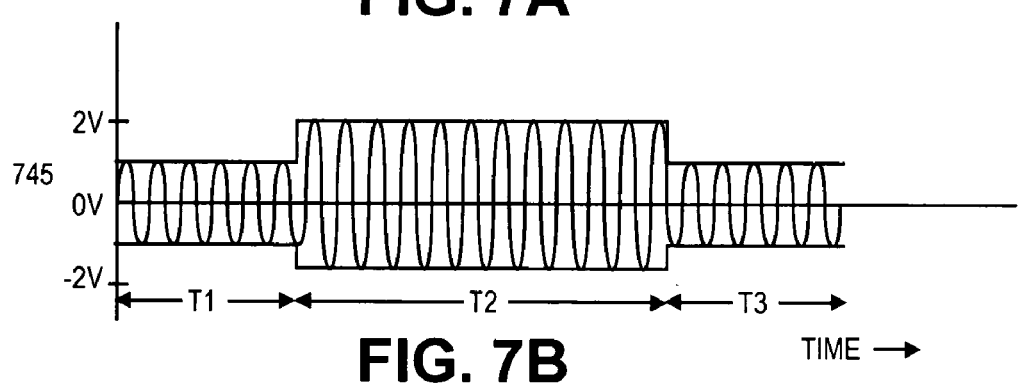
FIG. 7B shows a signal flow diagram of a sense voltage for FIG. 6.

FIG. 7B shows a signal flow diagram of a sense voltage for FIG. 6. FIG. 7B shows sense voltage 745 such as the voltage sensed at circuit 645 over time during period T1, T2, and T3. During period T1 sense voltage 745 includes the frequency of signal 320 (e.g., 140 kHz and a peak to peak voltage ranging between approximately negative 1 and positive 1 volts). Period T3 is similar to period T1. During period T2, voltage 745 ranges between approximately positive 2 volts and negative 1 volt. Thus, sensor 650 is able to discern the difference in voltage 745 such as at circuit 645 and determine whether relay 630 is switching appropriately.

Figure 8:
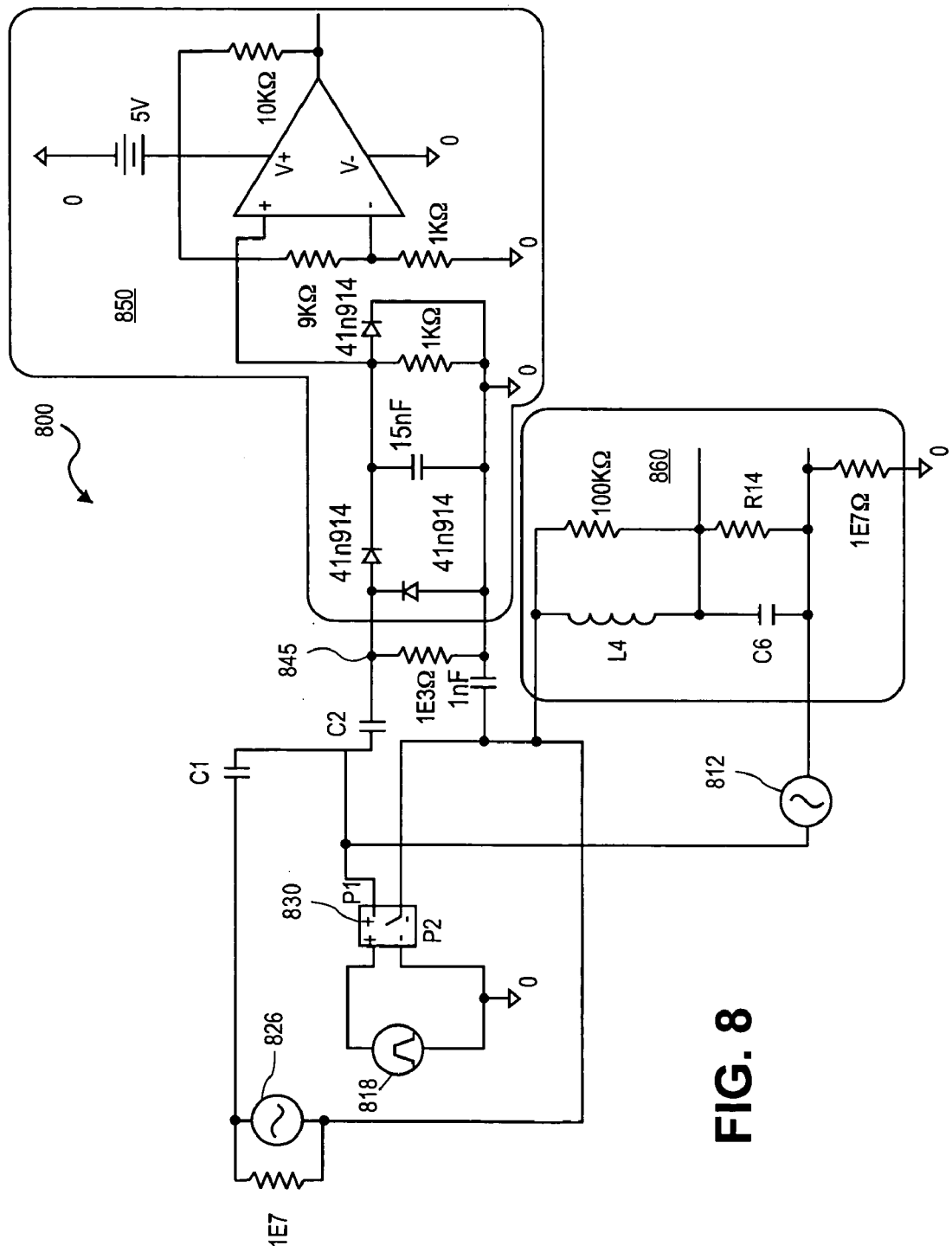
FIG. 8 shows an electronic circuit schematic diagram of a computer model of a reverse sense test circuit that may be applicable for any of FIGS. 3–5.

FIG. 8 shows an electronic circuit schematic diagram of a computer model of a reverse sense test circuit that may be applicable for any of FIGS. 3–5. For example, the computer model of FIG. 8 may be modeled in a computer aided design (CAD) application to simulate performance of FIG. 8 during operation. FIG. 8 shows system 800 similar to system 600 except that system 800 is designed to sense the test signal, frequency of the test signal, or the transfer function of the test signal from sine wave generator 826 across relay 830 when relay 830 is in position P2. Generator 826 may be similar to generator 626, except that generator 826 generates a sine wave instead of the square wave output by generator 626. System 800 includes generator 818 similar to generator 618, relay 830 similar to relay 630, power supply 860 having a function similar to power supply 660, circuit 845 having a function similar to circuit 645, and sensor 850 having a function similar to sensor 650 of FIG. 6. However, circuit 645 provides a voltage output with a larger magnitude when relay 830 is in position P2.

Specifically, FIG. 8 shows a full computer model of relay switching, power supply, sense and detection circuits of FIG. 6 acting in reverse to the circuits of FIG. 6. Thus, FIG. 8 shows a reverse sense circuit, where the sense voltage across R14 is there only when relay contacts are open (e.g., relay 830 is in position P2) and sensed voltage is close to zero when contact is closed (e.g., relay 830 is in position P1 and its relay contacts short sensed voltage through small C2 and C7 capacitors).

Figure 9A:
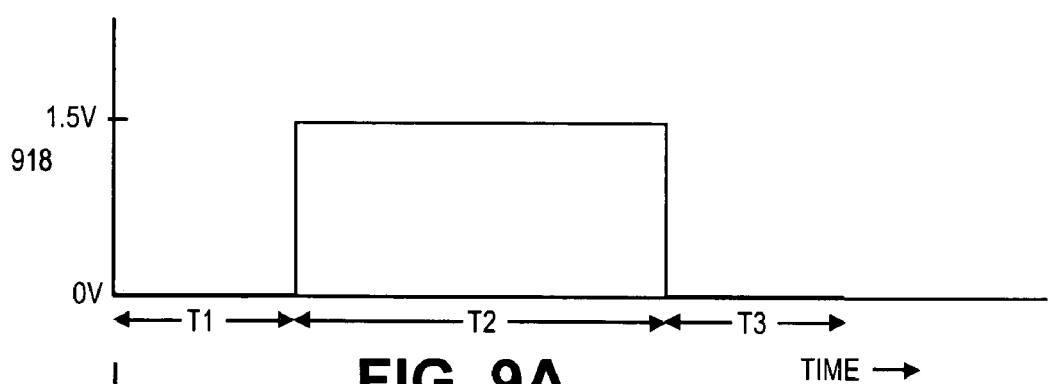
FIG. 9A shows a signal flow diagram of a relay actuation voltage for FIG. 8.

For example, FIG. 9A shows a signal flow diagram of a relay actuation voltage for FIG. 8. FIG. 9A shows relay activation voltage 918, similar to relay activation voltage 718.

Figure 9B:
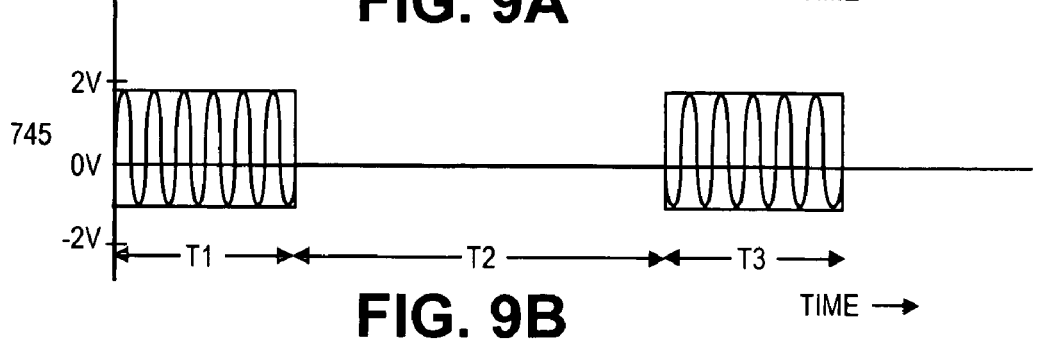
FIG. 9B shows a signal flow diagram of a reverse sense voltage for FIG. 8.

FIG. 9B shows a signal flow diagram of a reverse sense voltage for FIG. 8. FIG. 9B shows reverse sense voltage 945 during periods T1, T2, and T3, such as a sense voltage that allows sensor 850 to receive a logical "0", low signal, or inactive signal during period T2, when relay 830 is in position P1. Specifically, FIG. 9B shows voltage 945 having a peak to peak magnitude between approximately 2 volts and negative 1 volt during periods T1 and T3. Alternatively, voltage 945 has a magnitude of approximately 0 volts during period T2.

Additionally, according to embodiments of the invention, the contact closure impedance of AC or DC power transfer devices, switches, and relays may be tested or measured to determine when such relay or contact thereof is about to fail (e.g., such as using systems 1000 and 1100 described below for FIGS. 10–15). Contact closure impedance may be defined as the resistance and/or reactance between an input and an output of a switch or relay including across a contact closure of the switch or relay. The contact closure impedance may also be tested or measured to ensure proper relay contact closure, switch, coil, input connection, and output connection operation. For instance, contact closure impedance may be tested or measured while power is being switched or transferred across power transfer devices, switches, and relays during operation of a computing device, such as a network server. By knowing when a power transfer device, switch, or relay is about to fail, that relay can be replaced or repaired prior to needing it to switch power supply inputs to ensure the computing device does not fail.

Good or optimal AC or DC power switches or relays may have a contact closure impedance in the vicinity of 1 milli-Ohm or less (e.g., such as between approximately 10 and 0.1 milli-Ohms). However as the contacts age, degrade, become corroded, or "burn" (e.g., have carbon buildup at the point of electrical contact) this impedance increases. As the impedance increases, if the current the switch or relay carries is high, the contact eventually burns up. In practice, this is often the time, when a system operator first notices that there is a problem. Thus, the switch, relay or contact is a single point latency failure. To avoid such failures, the contact's impedance for the switch or relay can be periodically tested or measured by driving a high frequency (HF) oscillator output current through an isolating small capacitor and through the closed contact. The frequency of the HF signal is high enough to create or react with a contact closure impedance of the contact. Thus, an amplified HF voltage drop through the contact's impedance can then be measured to provide a warning to a system operator to replace or repair the switch or relay before the contact burns up.

Figure 10:
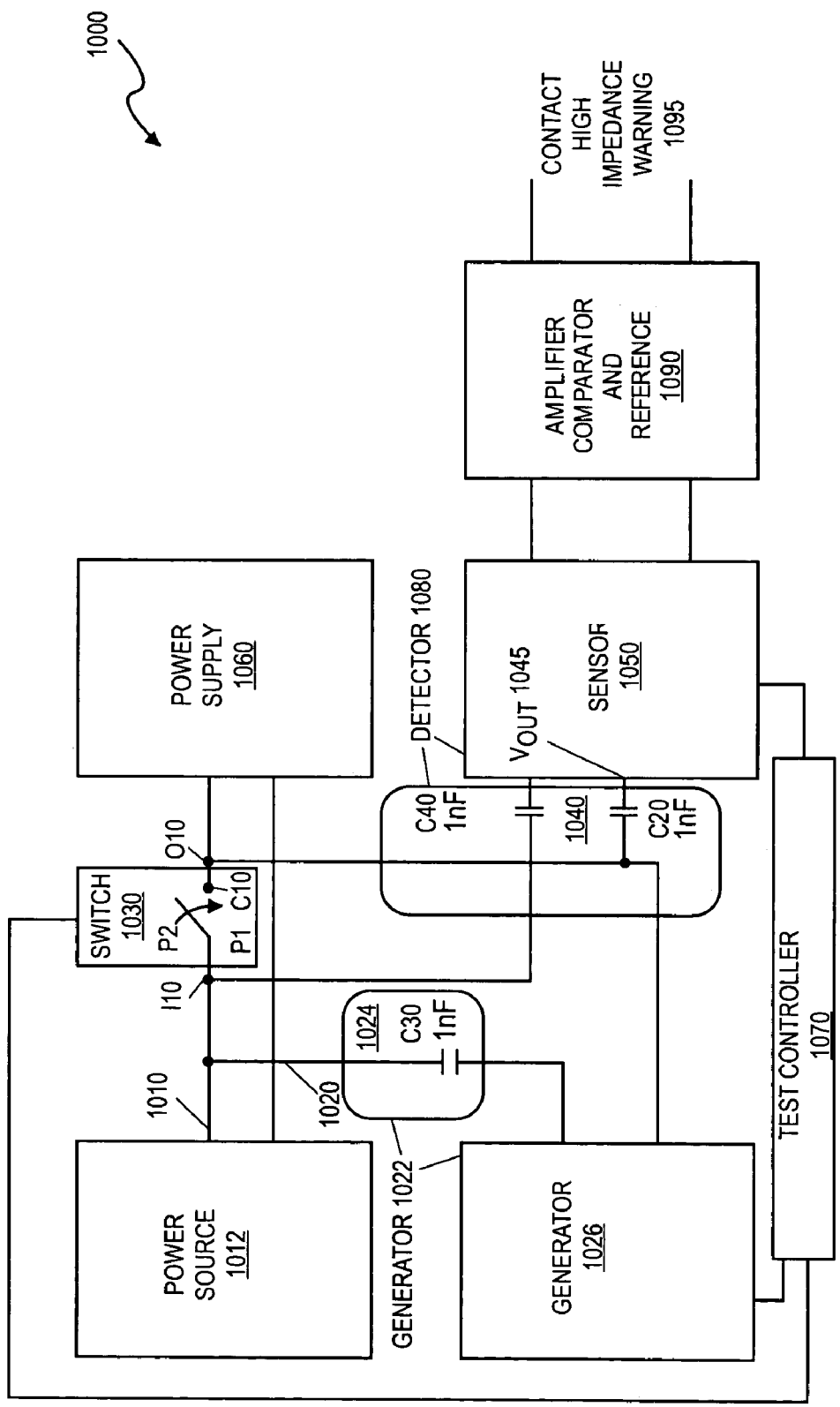
FIG. 10 is a block diagram showing a test circuit for testing contact closure impedance of a switch or relay in accordance with an embodiment of the invention.

Specifically, embodiments include a testing circuit and method for testing contact closure impedance of transfer devices, switches, and relays by using a test signal having a frequency distinct from the frequency of the signal being transferred, switched, or relayed across the tested device. For example, FIG. 10 is a block diagram showing a test circuit for testing contact closure impedance of a switch or relay in accordance with an embodiment of the invention. FIG. 10 shows system 1000 including switch 1030 coupled to power source 1012, filter 1024, filter 1040, power supply 1060, and test controller 1070. Test controller 1070 is also coupled to generator 1022 and sensor 1050. Filter 1040 provides output voltage Vout 1045 to sensor 1050. Sensor 1050 is coupled to an amplifier followed by a comparator and reference 1090, which can output contact high impedance warning 1095. Filter 1040 and sensor 1050 may be defined as detector 1080.

Generator 1022 provides a test signal to filter 1024 (e.g., capacitor C30) and filter 1024 provides the same signal as test signal 1020 to input I10 of switch 1030. Input I10 also receives power signal 1010 from power source 1012. The output of switch 1030 is 010, and is coupled to filter 1040 and power supply 1060. Also, generator 1022, filter 1024, filter 1040, sensor 1050, and optionally test controller 1070 may be defined as a test circuit for testing switch 1030.

Switch 1030 includes open circuit position at contact P2, and short circuit position at contact C10 connecting input I10 to output O10. Thus, in position P1, the connection of switch 1030 between input I10 and output O10 includes the impedance (including resistance and reactance) of the contact closure of switch 1030 to contact C1. When switch 1030 is in position P1, signals received at input I10 may be nearly short circuited or "shorted" to output I10 or may experience increased impedance depending on the age, degradation, and "burning" of contact C1. For FIG. 10, contact closure impedance may be defined as the resistance between an input and an output of a switch or relay including across a contact closure of the switch or relay. Specifically, contact closure impedance of switch 1030 may be the resistance between input I10 and output O10 across the contact closure of contact C10 excluding a circuit Q, resonance, or reactance.

It is also contemplated that switch 1030 may be a transfer device, switch, and/or relay as described above for switch 130, relay 230, and relay 330, of FIGS. 1–3. For instance, when contact C10 is in optimal or good condition, switch 1030 may have position P2 similar to position OC, and position P1 similar to position SC of FIG. 1. Optionally, switch 1030 may include other power inputs to switch to, such as input I2 of FIG. 2, which receive an alternate power signal (e.g., from a UPS or generator).

Moreover, it is contemplated that system 1000 may include more than one generator such as generator 1022 or a coupling from generator 1022 to more than one input of switch 1030 (e.g., such as the arrangement of relay 230 or 330 of FIGS. 2–3). In this arrangement, using the concepts described herein, more than one contact of switch 1030 can be tested or measured to determine contact closure impedance. Also, in this arrangement other characteristics or transfer functions of more than one contact of a transfer device, switch, and/or relay can be tested or measured as described herein and known in the art. Power supply 1060 may provide a load to source 1012, such as one or more mass storage devices (e.g., a disk drive), processors, memories, input devices, output devices, and/or other active or passive circuitry of an electronic or computing device, or otherwise as described above for power supply 260.

Power source 1012 may be an AC or DC power source or provide another signal as described above for signal 110 and/or generator 312.

Generator 1022 includes generator 1026, such as generator 326 and capacitor C30. Generator 1022 may be a high frequency test signal generator or oscillator such as generator 122 and/or 322. Also, generator 1026 may be different than generator 426, 526, 626, or 826, such as by generating a sine wave AC signal instead of a square wave signal. In some cases, generator 1026 may be similar to generator 826.

The relationship between the frequency of signal 1010 and signal 1020 may be similar to that described above for signal 110 and signal 120 of FIG. 1. Thus, it is contemplated that signal 1020 may have a frequency between approximately 1000 and 200000 times greater than the frequency of signal 1010. For example, signal 1020 may have a frequency that is approximately 1000, 2000, 3000, 5000, 10000, 20000, 40000, 80000, 160000, or a combination thereof times greater than the frequency of signal 1010. In addition, signal 1020 may have a maximum, or peak-to-peak voltage that is less than signal 1010 by a factor of approximately 2, 3, 4, 5, 10, 20, 40, 50, 100, 200, 400, 800 or a combination thereof. Specifically, signal 1020 may have a peak-to-peak voltage of approximately 1, 2, 2.5, 3, 4, 5, 7.5, 10, or a combination thereof of volts. For example, signal 1010 may be an approximately 50 or 60 Hz, approximately 120 or 240 volt power signal while signal 1020 is approximately 2.5 volts peak-to-peak at a frequency between approximately 1000 and 200000 times greater than signal 1010. Signal 1020 is distinguishable from signal 1010 by passive or active electronic circuitry, such as filters and/or a circuit created when switch 1030 is in position P1. Thus, signal generator 1022 or 1026 may be an auxiliary low power test signal generator to generate auxiliary low power test signal 1020 having a different frequency than power signal 1010 to test or measure contact closure impedance of switch 1030 while power signal 1010 is at input I10. The frequency of signal 1010 may be selected to be high enough to create or react with a contact closure impedance of the contact C10.

As shown in FIG. 10, filter 1024 includes capacitor C30 having a value of 1 nano (n)F coupled between generator 1026 and input I10. Capacitor C30 may be considered a "small coupling capacitor" as a filter to separate the power source line frequency and the test oscillator frequency circuit from each other. Filter 1024 may correspond to filter 224 and/or 234 described above with respect to FIGS. 2–3. Specifically, filter 1024 prohibits signal 1010 from reaching generator 1026 and damaging, destroying, "burning out", or otherwise inhibiting the functionality of generator 1026.

As shown in FIG. 10, filter 1040 includes capacitor C20 having a value of 1 nano (n) F coupled between output O10 and Vout 1045 of sensor 1050. Filter 1040 also includes capacitor C40 having a value of 1 nano (n) F coupled between input I10 and sensor 1050 (e.g., a reference of sensor 1050 or an amplifier therein). Capacitors C40 and C20 may be considered "small coupling capacitors" as a filter to separate the power source line frequency and the test oscillator frequency circuit from each other. Specifically, coupling capacitors C20 and C40 pick up the HF test signal (e.g., signal 1020) for a reading at voltage output Vout 1045. Thus, filter 1040 may filter out signal 1010 but allow second signal 1020 to pass to sensor 1050. For instance, due to the small test voltage drop across the small contact resistance of the contact(s), high amplification can be used in amplifier, comparator and reference generator 1090 to detect the small voltage drop. However, the high amplification allows some of power source 1012's low frequency signal 1010 to leak through capacitors C40 and C20 small capacitance. To eliminate this, a differential amplifier may be used which amplifies the differential high frequency test signal (e.g., signal 1020) from across the junction between C40 and C20, but cancels the common-mode low frequency signal (e.g., signal 1010) across the same junction between C40 and C20, and any junctions leaking through from generator 1026.

Specifically, when switch 1030 is in position P1, filter 1040 forms a test circuit tuned to test signal 1020's different frequency (as compared to signal 1010) to ensure that detector 1050 can detect the signal, frequency, and/or transfer function of signal 1020 at output O10. Also, in that position, filter 1040 forms a test circuit tuned to filter out or prohibit signal 1010 from passing through filter 1040 to sensor 1050 and damaging, destroying, "burning out", or otherwise inhibiting the functionality of sensor 1050. More particularly, in embodiments of the invention, generator 1022 is an auxiliary high frequency generator circuit of a low voltage signal to be passed from output O10 to sensor 1050 by filter 1040 (e.g., such as a filter having one or more "small" value capacitors).

Detector 1080, including filter 1040 and sensor 1050, detects, senses, monitors, or identifies the level or voltage of the auxiliary low power test signal (e.g., signal 1020) at output 1045 and if so, tests or measures contact closure impedance of contact C10 (e.g., when switch 1030 is in position P1). It is contemplated that a switch, or relay to be tested using system 1000 may be switched or tested for a period T between approximately 0.5 seconds and 10 seconds. For example, period T may be a period of approximately 0.1, 0.25, 0.3, 0.5, 1, 2, 3, 4, 10, 20, 40, 80, 160, 200, 400, 800, 1600, 3200, 6400 seconds or any combination thereof.

Sensor 1050 may sense voltage output Vout 1045 from filter 1040 and determine whether switch 1030 is functioning properly and/or which position switch 1030 is in from Vout 1045. Sensor 1050 detects all or a portion of the voltage of signal 1020 (e.g., in any case, at the frequency of signal 1020). Thus, when switch 1030 is in position P1, sensor 1050 can test or measure contact closure impedance of contact C10. Thus, the sensor 1050 may measure a transfer function of switch 1030 that includes the contact closure impedance of contact C10 (e.g., such as by measuring a resistance between input I10 and output O10 across the contact closure of contact C10 without measuring a circuit Q, resonance, or reactance).

In other words, sensor 1050 measures the high frequency test signal voltage drop across the contact closure of contact C10 (e.g., measures a portion of the voltage of signal 1020 created by the impedance of the contact closure at contact C10). An optimal or good the contact closure impedance may be between approximately 10 and 0.01 milli-Ohms, such as by being approximately 0.01, 0.02, 0.03, 0.05, 0.1, 0.5, 1, 2, 3, 5, or a combination thereof of milli-Ohms. Also, sensor 1050 may be a sensor or perform functions similar to sensor 150, 250, and/or 350 of FIGS. 1–3.

Sensor 1050 measures the high frequency test signal voltage drop across the contact closure of contact C10 (e.g., measures a portion of the voltage of signal 1020 created by the impedance of the contact closure at contact C10). Specifically, sensor 1050 may include a HF amplifier to measures the high frequency test signal voltage divided across the contact closure of contact C10 as compared to that of a reference signal, such as that across resistor having a selected value.

The a high frequency (HF) differential amplifier of sensor 1050 may be followed by a precision amplifier and rectifier (such as rectifier REC of FIG. 3). Specifically, the high precision rectifier may have a rectification inaccuracy between approximately 5% and 0.5%, such as by having a rectification innacuracy of approximately 0.25, 0.3, 0.5, 1, 2, 3, or a combination thereof of rectification innacuracy %.

Amplifier, comparator and reference generator 1090 may include comparators, amplifiers, reference signals, and/or reference signal generators to determine whether the tested or measured impedance of the closed contact exceeds a threshold limit (e.g., such as a limit selected according to a specification for a switch or relay, or selected by an operator, or otherwise). A comparator in 1090 may have a reference input to receive a reference voltage related to the selected threshold limit to compare to the rectified voltage output received from sensor 1050. Amplifier, comparator and reference generator 1090 may determine whether the tested or measured contact closure impedance of a contact of a device, switch, or relay is in the vicinity of 1 milli-Ohm or less (e.g., such as between approximately 10 and 0.1 milli-Ohms). If the tested or measured contact closure impedance exceeds a selected limit, or Vout 1045 exceeds a selected range, generator 1090 can output contact high impedance warning 1095, such as to a system operator to replace or repair the switch or relay before the contact burns up. For instance if the rectified DC output voltage received from sensor 1050 is greater than a DC reference voltage (e.g., a DC reference that corresponds to maximum allowable contact impedance), a warning may be issued, to indicate that there is too much impedance across contact closure or that the contact has "burned up". The warning may be issued such as by sending a signal as described below for FIG. 18.

It is contemplated that filter 1040, sensor 1050, and/or detector 1080 may include active and/or passive circuitry as described above for filter 140, sensor 150, and/or detector 180 of FIG. 1. Moreover, test controller 1070 may control turning on and off generator 1022 to turn on and off signal 1020. It is also considered that generator 1022 may continuously provide signal 1020. Also, test controller 1070 may cause switch 1030 to switch positions as described above for switch 130 of FIG. 1.

Test controller 1070 may be part of system 1000, such as part of a test circuit or automated system capable of testing contact closure impedance of switch 1030 without accessing internal components or opening a location including switch 1030, without manual intervention or access of switch 1030, a test connector thereto, or without human local or remote intervention, as described above for controller 170 of FIG. 1.

Test controller 1070 may have a processor, memory, etc., and/or may be computer or software controlled to periodically or otherwise automatically test contact closure impedance of switch 1030, as described above for controller 170 of FIG. 1. Thus, controller 1070 may test contact closure impedance of switch 1030 prior to the required switching of switch 1030 in a system, such as a computer or network server during a test, such as a maintenance test, periodic test, stress test, operational test, reliability test, manufacturer's test, integration test, or other test as known in the art. Embodiments of the invention also include a system without test controller 1070, as described above for controller 170 of FIG. 1.

It is also considered that generator 1022 as part of system 1000 may be permanently attached or coupled to input I10. Likewise, filter 1040, sensor 1050, and/or test controller 1070 may be permanently coupled or attached to switch 1030 and/or to each other as shown in FIG. 10. In some embodiments, generator 1022, sensor 1050, and/or switch 1030 may not be coupled to controller 1070, as described above for controller 170 of FIG. 1.

Similarly, with or without controller 1070; sensor 1050 and/or controller 1070 may warn of successful tests contact closure impedance of relays or switches, such as switch 1030, similar to the description of warning of failures, as described below at FIG. 17. In some embodiments, test controller 1070 may not control other operations of the computer, device, or system in which system 1000 exists, as described above for controller 170 of FIG. 1. Likewise, test controller 1070 may provide an output, warning, or indication of the input from sensor 1050 to a person or system, as described above for controller 170 of FIG. 1.

Thus, system 1000 may be used to contact closure impedance of test switch 1030 without a person opening the chassis or system in which system 1000 exists, while system 1000 is functioning, while a power signal, such as at signal 1010, is applied across switch 1030, without using an alternative or manual test device, such as a test meter, volt meter, or other manual device to test switch 1030.

Figure 11:
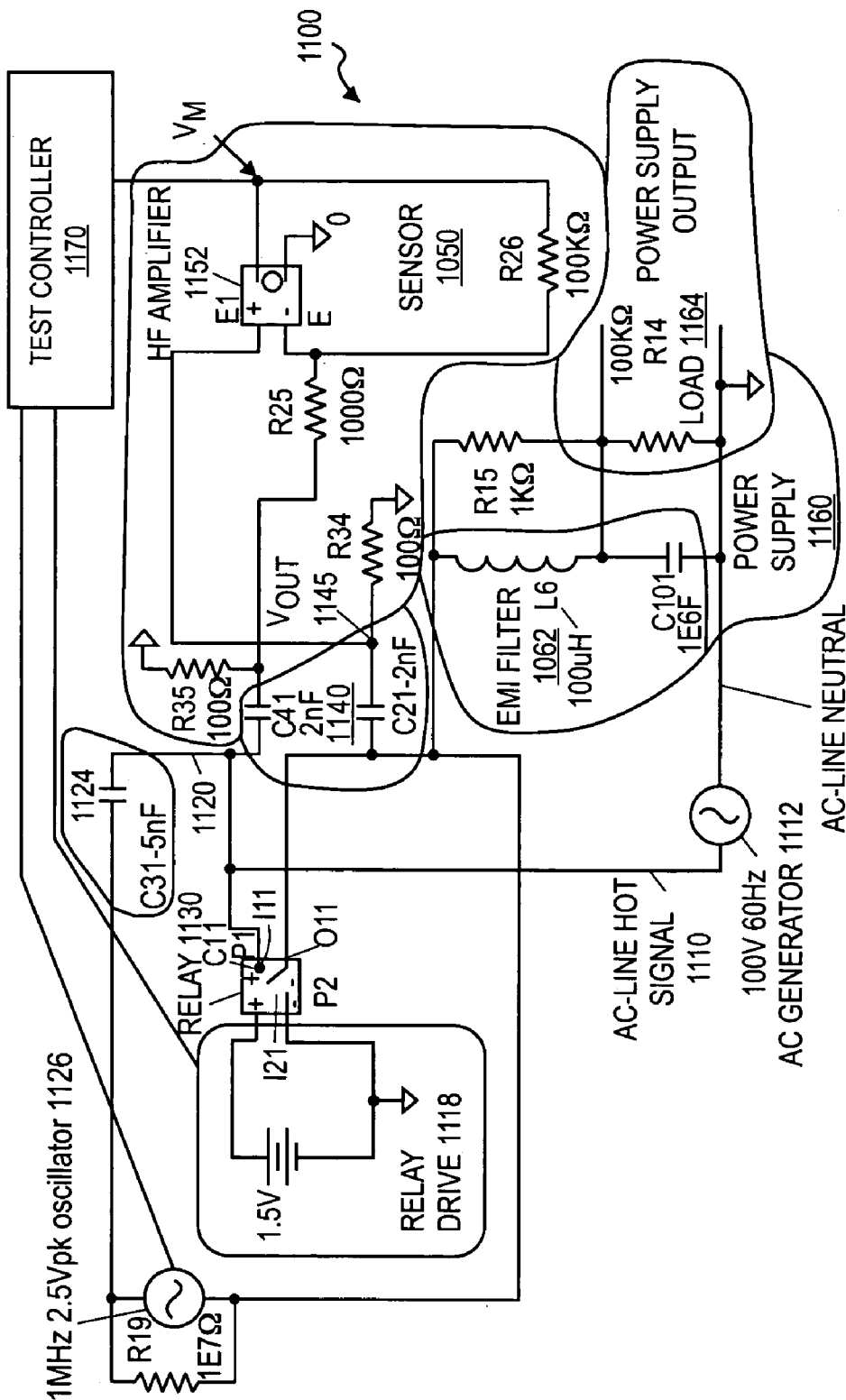
FIG. 11 shows an electronic circuit schematic diagram of a computer model that may be applicable for FIG. 10.

FIG. 11 shows an electronic circuit schematic diagram of a computer model that may be applicable for FIG. 10. For example, the computer model of FIG. 11 may be modeled in a computer aided design (CAD) application to simulate performance of FIG. 11 or system 1000 during operation. FIG. 11 shows system 1100 including relay 1130 coupled to filter 1124, filter 1140, power supply 1160 as an output load to AC line hot signal 1110, and test controller 1170. Test controller 1170 is also coupled to 1 mega(M)-Hz 2.5 V peak-to-peak oscillator 1126, relay drive 1118, and sensor 1150 (e.g., to measurement voltage Vm of sensor 1150). Filter 1140 provides output voltage Vout 1145 to sensor 1150. Filter 1140 and sensor 1150 may be defined as a detector, such as detector 1180.

Oscillator 1126 provides a signal to filter 1124 and filter 1124 provides the same signal as test signal 1120 to input I11. Input I11 also receives AC line hot signal 1110 (e.g., a power signal) from 100V 60 Hz AC generator 1112. Input I21 is open. Alternatively, input I21 may be connected to a signal, as described above for input I10. The output of relay 1130 is O11, and is coupled to filter 1140 and power supply 1160. The differential high frequency sensed (1 MHz) output of filters C41 and C21 (2 nano-F capacitors) is received by sensor 1150, which, amplifies, tests, measures, or senses the differential signal voltage across R34 and R35 (e.g., where R34 and R35 are both 100 Ohm resistors) by amplifier 1152, but cancels any low frequency common-mode signals leaked through from power source generator 1112. Sensor 1150 may be coupled to a comparator and reference, such as amplifier, comparator and reference 1090, which can output contact high impedance warning, such as warning 1095. Filter 1140 and sensor 1150 may be defined as detector 1180. Also, oscillator 1126, filter 1124, filter 1140, sensor 1150, and optionally test controller 1170 may be defined as a test circuit for testing relay 1130.

Relay 1130 may be a switch or relay as described for switch 130, relay 330, 830, or switch 1030 of FIGS. 1, 3, 8, or 10. For instance, relay 1130 may be a relay including switch 1030, to switch between positions P1 and P2. Thus, in position P1, the connection of relay 1130 between input I11 and output O11 includes the impedance (including resistance and reactance) of the contact closure of the switch in relay 1130 to contact C11. Specifically, contact closure impedance of relay 1130 may be the resistance between input I11 and output O11 across the contact closure of contact C11 excluding a circuit Q, resonance, or reactance.

Also, relay driver 1118 may be a generator or generate a relay activation signal as described for generator 618 or controller 370 of FIG. 6 or 3. Also, driver 1118 may switch a device, switch, or relay to be tested for period T between approximately 0.5 seconds and 10 seconds. For example, period T may be a period of approximately 0.1, 0.25, 0.3, 0.5, 1, 2, 3, 4, 10, 20, 40, 80, 160, 200, 400, 800, 1600, 3200, 6400 seconds or any combination thereof. Moreover, period T may rep-resent a test switching wave, such as a square wave, sine wave, or other wave as known in the art for switching the device, switch, or relay during testing.

Also, power supply 1160 may be a power supply such as power supply 260, 360, 660, or 1060 of FIGS. 2–3, 6 or 10.

100V 60 Hz AC generator 1112 may be an AC power source or provide another signal as described above for signal 110 and/or generator 312 of FIGS. 1 and 3.

According to embodiments, oscillator 1126 may be a generator such as generator 826 or 1026 of FIG. 8 or 10. For example, generator 1126 provides a test signal to filter 1124 (e.g., capacitor C31) and filter 1124 provides the same signal as test signal 1120 to input I11 of relay 1130. Generator 1026 may generate a sine wave AC signal.

The relationship between the frequency of signal 1110 and signal 1120 may be similar to that described above for signal 1010 and signal 1020 of FIG. 10. In some cases, signal 1110 may be an approximately 50 or 60 Hz, approximately 120 or 240 volt power signal while signal 1120 is approximately 2.5 volts peak-to-peak at a frequency between approximately 1000 and 200000 times greater than signal 1110. Signal 1120 is distinguishable from signal 1110 by passive or active electronic circuitry, such as filters and/or a circuit created when relay 1130 is in position P1.

As shown in FIG. 11, filter 1124 includes capacitor C31 having a value of 5 nano (n) F coupled between generator 1126 and input I11. Capacitor C31 may be considered a "small coupling capacitor" as a filter to separate the power source line frequency and the test oscillator frequency circuit from each other. Filter 1124 prohibits signal 1110 from reaching generator 1126 and damaging, destroying, "burning out", or otherwise inhibiting the functionality of generator 1126. Capacitor C31 may have a value of approximately 0.25, 0.3, 0.5, 1, 2, 3, 5, 10, or a combination thereof of nano (n) F. Moreover, filter 1124 may be a filter such as filter 324 or 1024 of FIG. 3 or 10.

As shown in FIG. 11, filter 1140 includes capacitor C21 having a value of 2 nano (n) F coupled between output O11 and Vout 1145 of sensor 1150. Filter 1140 also includes capacitor C41 having a value of 2 nano (n) F coupled between input I11 and resistor R25 (e.g., to reference input E of amplifier 1152). Capacitors C41 and C21 may be considered "small coupling capacitors" as a filter to separate the power source line frequency and the test oscillator frequency circuit from each other. Specifically, coupling capacitors C21 and C41 pick up the HF test signal (e.g., signal 1120) for a reading at voltage output Vout 1145. Thus, filter 1140 may filter out signal 1110 but allow second signal 1120 to pass to sensor 1150.

For instance, when relay 1130 is in position P1, filter 1140 forms a test circuit tuned to test signal 1120's different frequency (as compared to signal 1110) to ensure that detector 1150 can detect the signal, frequency, and/or transfer function of signal 1120 at output O11. Also, in that position, filter 1140 forms a test circuit tuned to filter out or prohibit signal 1110 from passing through filter 1140 to sensor 1150 and damaging, destroying, "burning out", or otherwise inhibiting the functionality of sensor 1150.

Capacitors C21 and/or C41 may having a value of approximately 0.25, 0.3, 0.5, 1, 2, 3, 5, 10, or a combination thereof of nano (n) F. Capacitor C21 and/or C41 may have matching values and have matching value resistors tied between their output (e.g., other side away from relay 1130) and ground, such as to form a differential amplifier with HF amplifier 1152. Also, Capacitor C21 and/or C41 may or may not have values that are matching, approximately ¾, ½, ⅓, ¼, ⅙, 1/10, or any combination thereof of the value of capacitor C31. Likewise, filter 1140 may be a filter such as filter 1040 of FIG. 10.

Sensor 1150, detects, senses, monitors, or identifies whether the auxiliary low power test signal (e.g., signal 1120) is at output 1145 and if so, may test or measure contact closure impedance of contact C11 (e.g., when relay 1130 is in position P1), as described above for sensor 1050 of FIG. 10.

Specifically, sensor 1150 detects the differential sensed voltage across resistors R35 and R34 which is proportional to the contact closure impedance of contact C11 (e.g., such as by measuring a resistance between input I11 and output O11 without measuring a circuit Q, resonance, or reactance). Sensor 1150 may be a sensor such as filter sensor 1050 of FIG. 10.

For instance, sensor 1150 measures a portion of the voltage of signal 1120 created by the impedance of the contact closure at contact C10 measured across resistors R35 and R34, and is amplified using a HF (high frequency) differential amplifier. For instance, as shown in FIG. 11, the value of resistor value of resistor R26 divided by the value of resistor R25 cause the signal at E1 to be amplified by 100 times. Specifically, this differential amplifier amplifies the differential high frequency test signal (e.g., signal 1120) from across the junction between R35-C41 and R34-C21, but cancels the common-mode low frequency signal (e.g., signal 1110) across the same junction between R35-C41 and R34-C21, and any junctions leaking through from oscillator 1126. Other amplification values are considered greater or less than 100.

Moreover, differential amplifier of sensor 1150 negates or equals out the power signal of line. The common-mode voltage from generator 1112 low frequency AC power source leaking through capacitors C41 and C21's 2 nF capacitance, and appearing across resistors R34 and R35 resistance may be higher than the voltage caused by the differential low frequency signal across the closed contact and leaking through capacitors C41 and C21's 2 nF capacitance, thus causing a measuring error to a non-differential amplifier embodiment. Therefore a differential amplifier may be employed to cancel the common-mode low frequency signals sensed across resistors R34 and R35, and to amplify the dominant HF differential signal from signal 1120 across the closed contact impedance.

The a high frequency (HF) differential amplifier of sensor 1150 may be followed by a precision rectifier as described above for sensor 1050 of FIG. 10. Specifically, the high precision rectifier may be coupled to measurement voltage Vm. The precision rectifier may be coupled to an amplifier, comparator and reference generator such as amplifier, comparator and reference generator 1090 of FIG. 10.

Test controller 1170 may be a test controller similar to controller 1070 of FIG. 10.

It is also considered that generator 1126 as part of system 1100 may be permanently attached or coupled to input I1. Likewise, filter 1124, 1140, sensor 1150, and/or test controller 1170 may be permanently coupled or attached to relay 1130 and/or to each other as shown in FIG. 11. In some embodiments, generator 1126, sensor 1150, and/or relay 1130 may not be coupled to controller 1170, as described above for controller 1070 of FIG. 10.

Figure 12:
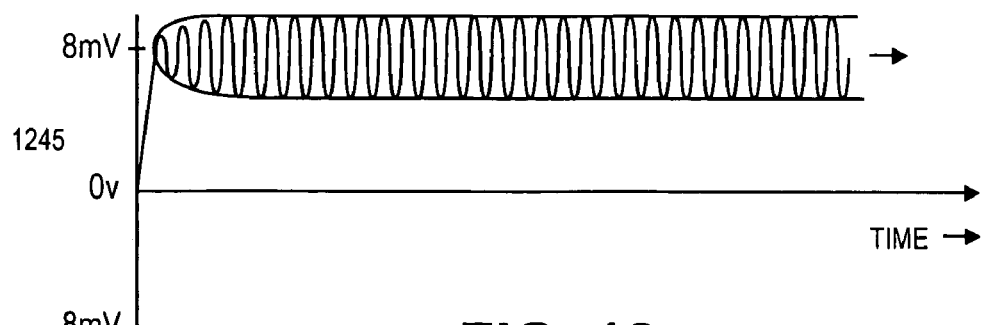
FIG. 12 shows a signal flow diagram of a sense voltage to measure a first contact closure impedance for FIG. 10 or 11.

FIG. 12 shows a signal flow diagram of a sense voltage to measure a first contact closure impedance for FIG. 10 or 11. FIG. 12 shows sense voltage 1245 such as the voltage sensed at output voltage Vout 1045 or 1145 of FIG. 10 or 11. Sense voltage 1245 has only a 9 milli(m)-V peak (with 3 mV peak to peak). Sense voltage 1245 may represents the contact closure impedance of a good or optimal contact or contact closure. For instance, sense voltage 1245 may be a voltage measure or tested for a contact closure having an impedance of 0.1 milli(m)-Ohms (e.g., 0.0001 Ohms).

Thus, sensor 1050 or 1150 (e.g., using amplifier 1152 and a precision rectifier) could discern a difference in voltage 1245 to determine whether a switch or relay has aged, degraded, become corroded, or "burned" by a high value or measured increase over time (such as determined by periodically testing) of contact closure impedance. An inappropriate value or increase in the contact's impedance (e.g., such as compared to the reference voltage for amplifier 1152 and/or reference 1090) can then be measured to provide a warning to a system operator to replace or repair the switch or relay before the contact burns up.

Figure 13:
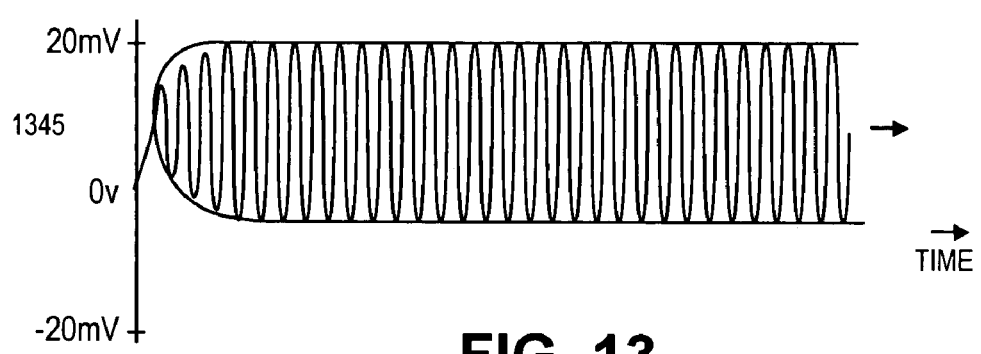
FIG. 13 shows a signal flow diagram of a sense voltage to measure a second contact closure impedance for FIG. 10 or 11.

For instance, FIG. 13 shows a signal flow diagram of a sense voltage to measure a second contact closure impedance for FIG. 10 or 11. FIG. 13 shows sense voltage 1345 such as the voltage sensed at output voltage Vout 1045 or 1145 of FIG. 10 or 11. Sense voltage 1345 has a 20 milli(m)-V peak (with 25 mV peak to peak). Sense voltage 1345 may represents the contact closure impedance of a less than good or optimal, but still functional for power signals (e.g., such as signal 1010 or 1110) contact or contact closure. For instance, sense voltage 1345 may be a voltage measure or tested for a contact closure having an impedance of 1 milli(m)-Ohms (e.g., 0.001 Ohms).

Figure 14:
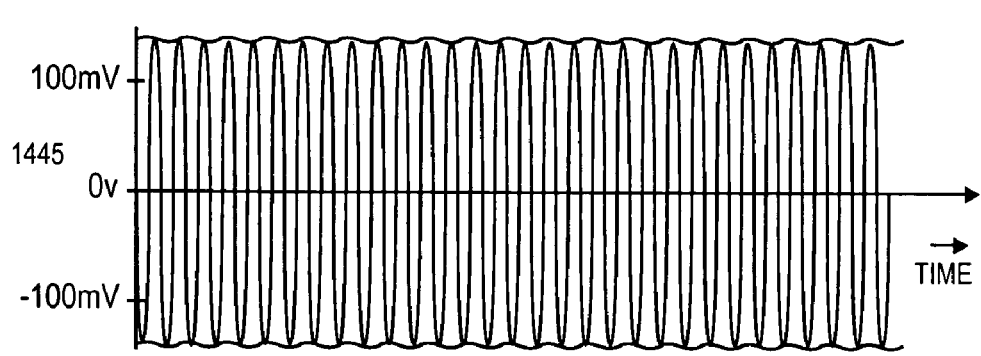
FIG. 14 shows a signal flow diagram of a sense voltage to measure a third contact closure impedance for FIG. 10 or 11.

FIG. 14 shows a signal flow diagram of a sense voltage to measure a third contact closure impedance for FIG. 10 or 11. FIG. 14 shows sense voltage 1445 such as the voltage sensed at output voltage Vout 1045 or 1145 of FIG. 10 or 11. Sense voltage 1445 has a 140 milli(m)-V peak (with 260 mV peak to peak). Sense voltage 1445 may represents the contact closure impedance of an almost ready to fail or degraded, but still functional for power signals (e.g., such as signal 1010 or 1110) contact or contact closure. For instance, sense voltage 1445 may be a voltage measure or tested for a contact closure having an impedance of 10 milli(m)-Ohms (e.g., 0.01 Ohms).

Figure 15:
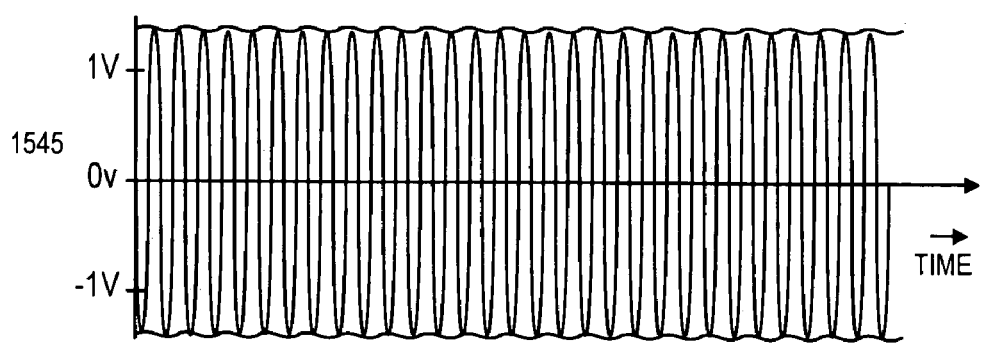
FIG. 15 shows a signal flow diagram of a sense voltage to measure a fourth contact closure impedance for FIG. 10 or 11.

FIG. 15 shows a signal flow diagram of a sense voltage to measure a fourth contact closure impedance for FIG. 10 or 11. FIG. 15 shows sense voltage 1545 such as the voltage sensed at output voltage Vout 1045 or 1145 of FIG. 10 or 11. Sense voltage 1545 has a 1.3 V peak (with 2.5 V peak to peak). Sense voltage 1545 may represents the contact closure impedance of a ready to fail or very degraded, but currently functional for power signals (e.g., such as signal 1010 or 1110) contact or contact closure. However, in the near future, due to its high impedance, the contact may fail to sufficiently connect a power signal or may burn up when or while connecting a power signal (e.g., such as signal 1010 or 1110) across a switch or relay. For instance, sense voltage 1545 may be a voltage measure or tested for a contact closure having an impedance of 100 milli(m)-Ohms (e.g., 0.1 Ohms).

Figure 16:
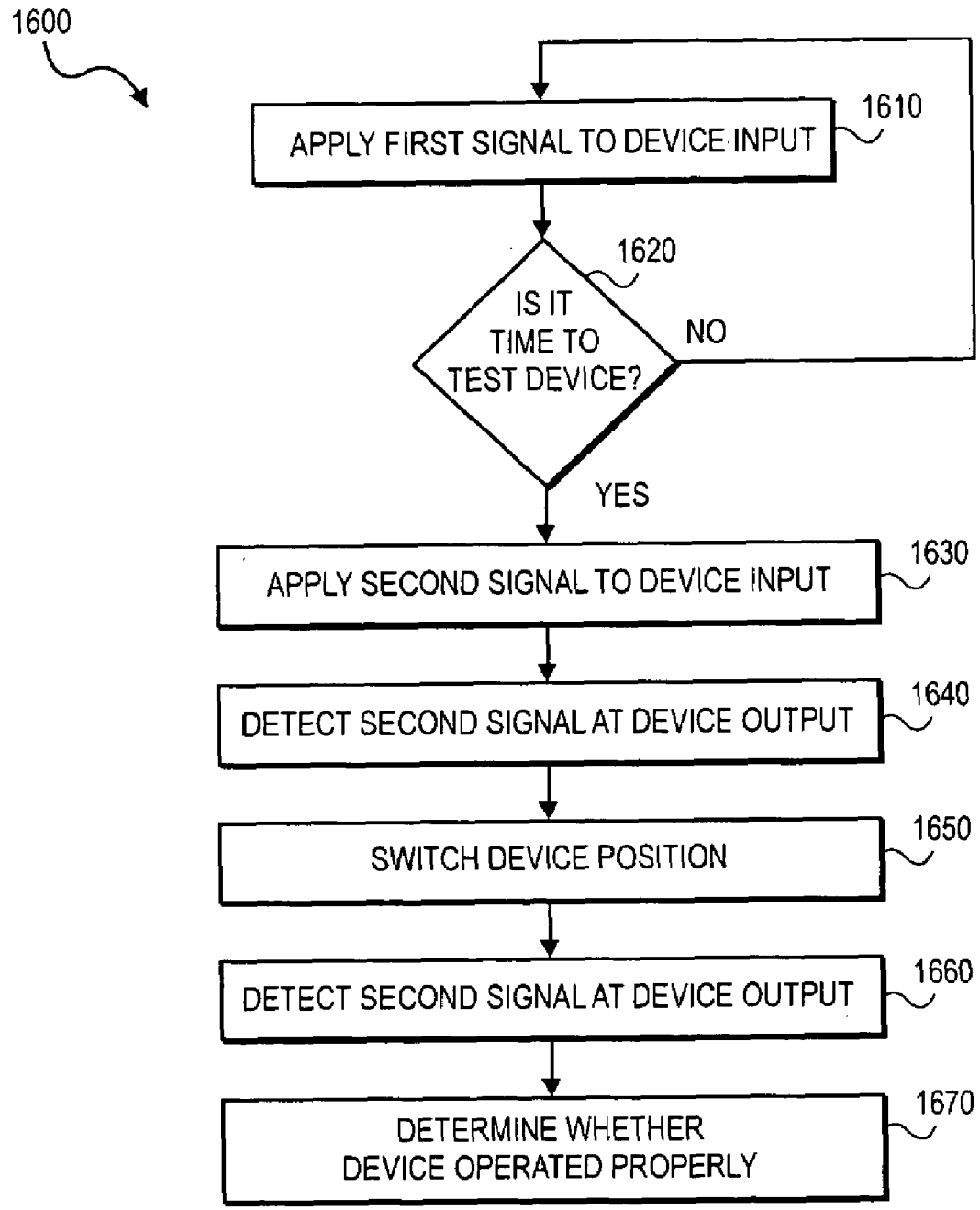
FIG. 16 shows a flow diagram of a process for testing a relay or a switch using any of the test circuits described for FIGS. 1–6, 8, and 10–11.

FIG. 16 shows a flow diagram of a process for testing a relay or a switch using any of the test circuits described for FIGS. 1–6, 8, and 10–11. FIG. 16 shows process 1600, such as a process for testing a device, switch, or relay as described with respect to system 100, system 200, system 300, system 400, system 500, system 600, system 800, system 1000, or system 1100 of FIGS. 1–6, 8, and 10–11 Specifically, process 1600 may be used to test a transfer device, switch or relay using generator 122, controller 170, filter 140, and sensor 150 of FIG. 1; filter 224, generator 222, controller 270, filter 240, and sensor 250 of FIG. 2; filter 324, generator 322, controller 370, filter 340, and sensor 350 of FIG. 3; the test circuitry shown for FIG. 4; the test circuitry shown for FIG. 5; circuitry according to the computer modeled test circuitry of FIG. 6; and/or circuitry according to the computer modeled test circuitry of FIG. 8; filter 1024, generator 1022, controller 1070, filter 1040, sensor 1050, and reference 1090 of FIG. 10; filter 1124, generator 1122, controller 1170, filter 1140, and sensor 1150 of FIG. 11. At block 1610 a first signal is applied to an input of a device to be tested. For example, block 1610 may correspond to applying signal 110, 210 (and optionally 216), 310 (and optionally 316); or a signal from generator 412, 512, 612, 812, 1012, or 1112 as described with respect to FIGS. 1–6, 8, and 10–11.

At block 1620 it is determined whether it is time to test the device, circuit, or relay. If it is not time to test the device, the process returns to block 1610. Alternatively, if at block 1620 it is time to test the device, processing continues to block 1630. At block 1630 a second signal is applied to the device input. Block 1630 may correspond to applying signal 120, signal 220, signal 320; or a signal from generator 426, 526, 626, 826, 1026, or 1126 as described with respect to FIGS. 1–6, 8, and 10–11.

It is contemplated that block 1630 may include continuously applying the second signal to the input or switching the signal on and off, such as by switching generator 122, 222, 322, 426, 526, 626, 826, 1026, or 1126 on and off as described above with respect to FIGS. 1–6, 8, and 10–11. Specifically a test controller such as controller 170, 270, 370, 1070, or 1170 may be used to apply or switch on and off the second signal at block 1630. Thus at block 1630 the test signal (e.g., such as a high frequency low power test signal applied to the device input) may be permanently or always on.

At block 1640 the second signal is detected at the output of the device tested. Block 1640 may correspond to detector 180 detecting or not detecting signal 120 at output 134; detector 280 detecting or not detecting signal 220 at output O1, detector 380 detecting or not detecting signal 320 at output O1; detector 1080 detecting a proper voltage at Vout 1045; or sensor 1150 detecting a proper voltage at Vout 1145 of FIGS. 1–3, and 10–11. Specifically, the signal detected or not detected may be provided to controller 170, 270, 370, 1070, or 1170.

Next at block 1650 the position of the device being tested is switched. For example, block 1650 may correspond to switching between position P1 and position P2; or between contact C01 and contact C02; or between an open circuit and the short circuit position of switch 130, relay 230, relay 330; switch 1030, or relay 1130 of FIGS. 1–3 and 10–11. For instance, for system 1000, at block 1650 switch 1030 may be switched to test contact closure impedance for another contact of the device, switch or relay (e.g., the contact at position P2). Similarly, for system 1100, at block 1650 relay 1130 may be switched to test contact closure impedance for another contact of the device, switch or relay (e.g., the contact at position P2). Optionally, for system 1000 or 1100, blocks 1650, and (1660 or 1640) may be skipped, such as contact closure impedance is only tested for one contact of a switch or relay (e.g., the contact at position P1).

At block 1660 the second signal is again detected at the device output. Block 1660 may correspond to detector 180 detecting or not detecting signal 120 at output 134; detector 280 detecting or not detecting signal 220 at output O1, or detector 380 detecting or not detecting signal 320 at output O1; detector 1080 detecting a proper voltage at Vout 1045; or sensor 1150 detecting a proper voltage at Vout 1145 of FIGS. 1–3, and 10–11. Specifically, the signal detected or not detected may be provided to controller 170, 270, 370, 1070, or 1170. Moreover, block 1660 may correspond to the description above with respect to block 1640.

At block 1670 it is determined whether the device, switch, or relay operated properly. For example, if the device, switch, or relay is functioning properly, the second or test signal should be detected at either block 1640 but not at block 1660; or at block 1660 but not at block 1640. Alternatively, if the second signal is not detected at either block 1640 or block 1660, failure of the device, switch, or relay may be indicated (e.g., the device started in position P2 and did not switch to position P1). Similarly, if the second signal is detected at both block 1640 and block 1660, failure of the device, switch, or relay may be indicated (e.g., the device started in position P1 and did not switch to position P2)

Furthermore, either at block 1640 or at block 1660, detector 1080 should detect a proper voltage at Vout 1045; or sensor 1150 should detect a proper voltage at Vout 1145 for the contact closure impedance of a device, switch, or relay of FIGS. 10–11. Otherwise, an improper voltage may indicate that the device, switch, or relay is about to fail.

In some embodiments of the invention, system 100, 200, 300, 400, 500, 600, 800, 1000, and 1100; and/or controller 170, 270, 370, 1070, and/or 1170, may include or access a machine-accessible medium containing a sequence of instructions that when executed by a machine or processor cause that system and/or controller to perform the functions described for that system or controller, herein. Specifically, when executed by a machine or processor, the instructions may cause the system and/or controller to apply a power signal, initiate a high frequency test signal, switch a switch or relay, filter out the power signal, and/or detect the high frequency test signal or proper contact closure impedance at the output of the test or relay as described herein.

Moreover, the systems, generators, controllers, filters, and sensors described herein may represent or include electronic hardware, passive circuitry, active circuitry, logic, and/or processors executing one or more set of software instructions. Any or each of the systems and/or controllers described herein may include one or more processors, and memories to store an application (e.g., such as a software application, source code, a sequence of instructions, or compiled code) to be executed by the processor or a machine to cause the system or controller to perform the functions described herein. Specifically, a system or controller may be controlled by a computer or a machine, such as according to a machine accessible medium containing instructions (e.g. software, source code, or compiled code) that when executed by the computer or machine cause the system or controller to control signal generator 122, 222, 322, 426, 526, 626, 826, 1022, or 1122; switch 130, relay 230, 330, 430, 530, 630, 830, 1030, or 1130; filter 140; sensor 150, 250, 350, 650, 850, 1050, or 1150, and analyze readings thereof, as described herein.

Figure 17:
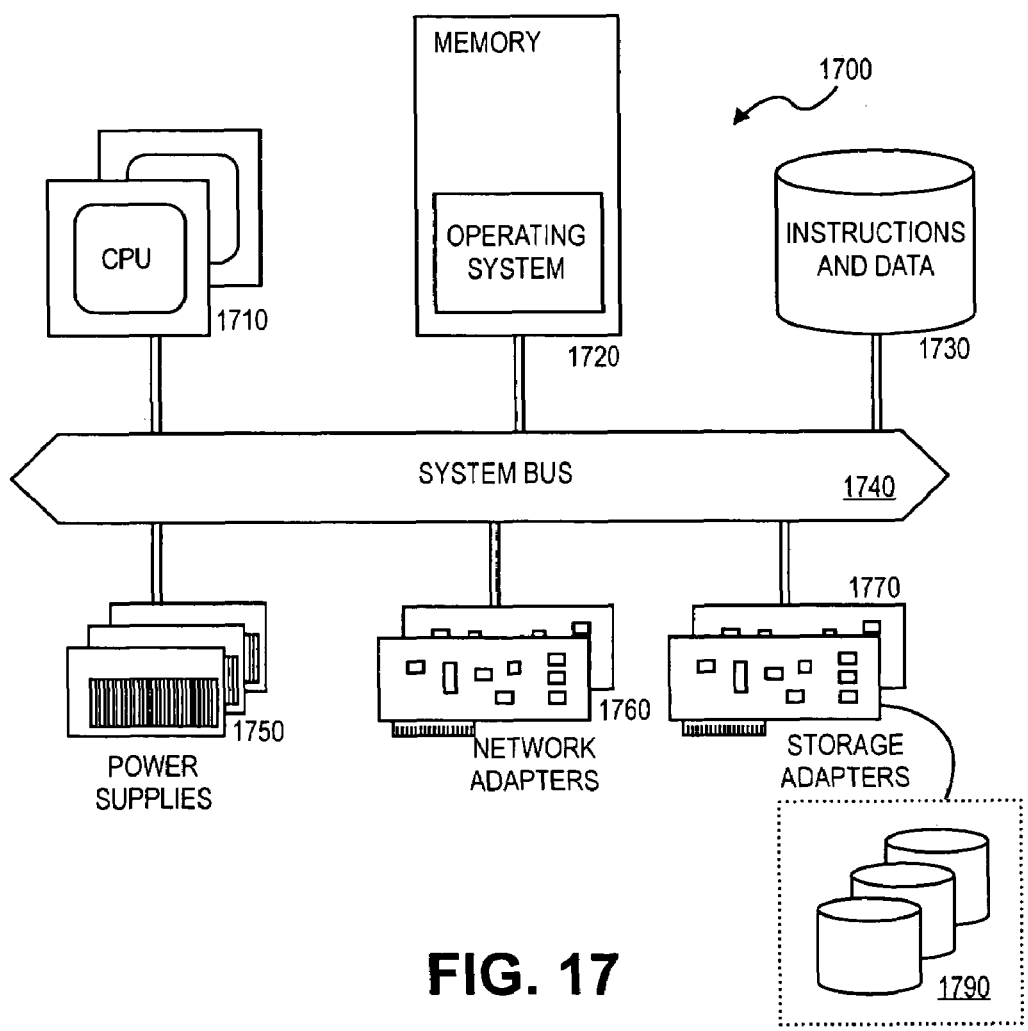
FIG. 17 shows a block diagram of a representative system in which an embodiment of the invention may be included and used.

For example, FIG. 17 shows a block diagram of a representative system in which an embodiment of the invention may be included and used. FIG. 17 shows system 1700, in which may exist system 100, 200, 300, 400, 500, 600, 800, 1000, or 1100; and/or controller 170, 270, 370, 1070, and/or 1170. System 1700 includes central processing units (CPU) 1710 to execute instructions stored in memory 1720, in order to perform functions of systems and/or controllers as described herein. CPUs 1710 may also execute instructions stored in memory 1720 to control and coordinate the operation of other devices attached to system bus 1740. Storage device 1730 may provide long-term storage for instructions and data not presently in use by CPUs 1710. Network adapters 1760 and storage adapters 1770 (connected to storage devices 1790) permit the system to communicate with other computer systems and to provide services (for example, data storage and retrieval services) through other systems.

Power supplies 1750 may be configured according to an embodiment of the invention with switches or relays between one or more of the power supplies and one or more power lines (e.g. such as is shown above with respect to relay 230, power supply 260, and signal 210 and 216 of FIG. 2; relay 330, signal 316 and 310, and power supply 360 of FIG. 3; switch 1030, power supply 1060, and signal 1010 of FIG. 10; and relay 1130, signal 1110, and power supply 1160 of FIG. 11). Moreover, power supplies 1750 may include systems 100, 200, 300, 400, 500, 600, 800, 1000, and/or 1100 for testing power supplies 1750. Alternatively, those systems may be located elsewhere within system 1700 for testing power supplies 1750. Specifically, those systems may provide for testing supplies 1750 without accessing supplies 1750 manually, externally, with a portable test meter, or without otherwise opening or accessing the internal components of system 1700 from outside that system.

Moreover, memory 1720 may contain a sequence of instructions that when executed (e.g., perhaps as part of the indicated operating system) causes CPUs 1710 to poll test circuits, systems, or controllers described above with respect to systems 100, 200, 300, 400, 500, 600, 800, 1000, and/or 1100 to detect and warn of failed or soon to fail contact closures of relays or switches. Alternatively, systems, controller, detectors, and/or sensors described herein may be polled (such as by a local or remote person, machine, computing device, or network server) to detect and warn of failed or soon to fail contact closures of relays or switches.

Polling may occur on a periodic schedule, or in response to an event internal or external to system 1700. Mechanical constraints imposed by the switches or relays may place an upper bound on the frequency of the polling tests. For example, repeating a test every second or fraction of a second may result in spurious failure indication or increase the likelihood of switch or relay failure, or contacts thereof (e.g. such as by wearing the switch or relay out). Warning or indication of a failed test may take the form of a visible or audible alarm, an electronic entry in a log or table, or a message sent via e-mail or another method to another machine, a person, a system administrator, or otherwise. For example, controller 170, 270, 370, 1070, or 1170 may provide such warning or indication. Other warning mechanisms may be appropriate.

Instructions, such as a sequence of instructions to cause a processor, machine, or system 1700 to perform the functions of a system or controllers described herein may be stored on a machine readable medium such as a disk drive, compact disk read-only memory (CDROM), magnetic tape, optical media, or other persistent memory devices. Also, such instructions may be transmitted to the system, controller, computing system, or system 1700 over a physical or virtual data connection, over the Internet, over a network, and/or via wireless communication.

The concepts herein may also be applied to ensure functionality of signal transfer devices, switches, and/or relays to provide, prohibit, switch, or transfer power, analog, digital data and/or signals between circuits and components of electronic devices, power transformers, power relays, audio devices, video devices, computers, network servers, etc.

Moreover, the concepts herein may also be applied to testing and measuring contact closure impedance or other electrical, magnetic, thermal characteristics or transfer functions of a transfer device, switch, and/or relay as described herein and known in the art. For example, the capacitance; inductance; change of resistance due to change of temperature; change of resistance, capacitance, and/or inductance due to a magnetic field of a transfer device, switch, relay, and/or contacts thereof may be determined using the systems and/or concepts described herein.

In the foregoing specification, specific embodiments are described. However, various modifications and changes may be made thereto without departing from the broader spirit and scope of embodiments as set forth in the claims. For instance, the concepts herein may also be applied to ensure functionality of signal transfer devices, switches, and/or relays to provide, prohibit, switch, or transfer power, analog, digital data and/or signals between circuits and components of electronic devices, power transformers, power relays, audio devices, video devices, computers, network servers, etc. The specification and drawings are, accordingly, to be regarded in an illustrative rather than a restrictive sense.

What is claimed is:

1. An apparatus comprising:
   a device having a first transfer function between an input and an output in response to a first frequency, and a second transfer function between the input and the output in response to a second frequency;
   a first signal coupled to the input to generate the first frequency;
   a signal generator coupled to the input to generate at the input a signal having the second frequency, which is different from the first frequency; and
   a detector to detect the second frequency at the output, wherein the detector comprises a filter and a sensor, the filter to filter out the first frequency from reaching the sensor, wherein the filter comprises a high Q circuit at the second frequency and a low Q circuit at the first frequency.

2. The apparatus of claim 1, wherein the first transfer function and the second transfer function are a short circuit transfer function, and detecting the second frequency identifies that the first transfer function exists.

3. The apparatus of claim 1, wherein first signal is a power signal having a frequency between approximately 50 Hz and 60 Hz, a voltage of between approximately 120 and 240 volts from one of a wall outlet and an uninterrupted power supply, and the second frequency is between approximately 100 and 100,000 times greater than the first frequency.

4. The apparatus of claim 1, wherein the detector and second frequency generator are permanently coupled to the device.

5. The apparatus of claim 1, wherein the high-Q circuit has a resonance peak Q at the second frequency and wherein the low-Q circuit has a Q at least twenty percent lower than the resonance peak Q at the first frequency.

6. The apparatus of claim 1, wherein the high-Q circuit is a short circuit and wherein the low-Q circuit is an open circuit.

7. An apparatuas comprising:
   a device having a first transfer function between an input and an output in response to a first frequency, and a second transfer function between the input and the output in response to a second frequency;
   a first signal coupled to the input to generate the first frequency;
   a signal generator coupled to the input to generate at the input a signal having the second frequency, which is different from the first frequency; and
   a detector to detect the second frequency at the output, wherein the device is a switch having a first position and a second position, and the detector is to detect whether the second frequency is at the output when the switch is in the first position or the second position.

8. The apparatus of claim 7, wherein the switch comprises a relay having a relay input to switch the relay between the first position and the second position.

9. The apparatus of claim 8, further comprising a controller coupled to the relay input to switch the relay from the first position to the second position, to activate the signal generator.

10. An apparatus comprising:
    a device having a first transfer function between an input and an output in response to a first frequency, and a second transfer function between the input and the output in response to a second frequency;
    a first signal coupled to the input to generate the first frequency;
    a signal generator coupled to the input to generate at the input a signal having the second frequency, which is different from the first frequency; and
    a detector to detect the second frequency at the output, wherein the first transfer function and the second transfer function comprise a contact closure impedance, and the detector detects the contact closure impedance.

11. An apparatus comprising:
    a device having a first transfer function between an input and an output in response to a first frequency, and a second transfer function between the input and the output in response to a second frequency;
    a first signal coupled to the input to generate the first frequency;
    a signal generator coupled to the input to generate at the input a signal having the second frequency, which is different from the first frequency; and
    a detector to detect the second frequency at the output, wherein the detector comprises a filter to filter out the first signal from reaching a voltage output, and a sensor to sense the voltage output, the voltage output depending upon a contact closure impedance.

12. The apparatus of claim 11, wherein the sensor comprises:

a rectifier to rectify the voltage output to an output direct current voltage; a reference input to receive a reference voltage to compare to the voltage output; and a warning signal generator to generate a warning signal if the voltage output is greater than the output direct current voltage.

13. A machine implemented method comprising:
applying a power signal to an input of a relay that outputs a signal from the input to an output of the relay when the relay is in a first position and does not output the signal to the output when the relay is in a second position;
initiating a high frequency signal applied to the input;
activating a switch signal to switch the relay from the second position to the first position, after said initiating;
filtering the power signal from the high frequency signal output from the output; and
detecting the high frequency signal at the signal output from the output.

14. The method of claim 13, wherein the relay has a contact closure impedance in the first position and detecting includes measuring the contact closure impedance.

15. The method of claim 13, further comprising permanently activating the high frequency signal applied to the input.

16. The method of claim 13, further comprising:
switching the relay from the first position to the second position, after detecting;
filtering the power signal from the high frequency signal output from the output;
detecting absence of the high frequency signal at the signal output from the output.

17. The method of claim 13, wherein the sensor activates the high frequency signal and switches the relay.

18. The method of claim 13, further comprising repeating switching, filtering, and sensing after a period of between approximately 0.5 seconds and 10 seconds.

19. The method of claim 13, further comprising deactivating the high frequency signal; and periodically performing the initiating, activating, filtering, and detecting.

20. The method of claim 13, wherein a processor executes a sequence of instructions causing the initiating, activating, filtering, and sensing.

21. An apparatus comprising:
a relay having an input, an output, a first position that outputs a signal at the input to the output, and a second position that does not output at the input to the output;
a power signal at the input having a first frequency;
a signal generator coupled to the input to generate at the input a test signal having a second frequency, the second frequency at least 100 times greater than the first frequency;
a sensor to detect the second frequency at the output; and
a filter coupled between the output and the sensor to filter out the first frequency from reaching the sensor.

22. The apparatus of claim 21, further comprising a controller coupled to the relay to switch the relay from the first position to the second position, and coupled to the signal generator to turn the signal generator on and off.

23. The apparatus of claim 22, wherein the controller, signal generator, sensor, and filter are permanently coupled to the relay.

* * * * *